(12) United States Patent
Tucholski et al.

(10) Patent No.: US 6,747,583 B2
(45) Date of Patent: Jun. 8, 2004

(54) COMPENSATING CIRCUIT FOR USE IN A SWITCH CIRCUIT COMPRISING SCALED CURRENT STEERING SWITCHES, A SWITCH CIRCUIT COMPRISING THE COMPENSATING CIRCUIT, AND A METHOD FOR MINIMISING TIME-SKEW IN SWITCHING SCALED CURRENT STEERING SWITCHES

(75) Inventors: Hans Juergen Tucholski, Limerick (IE); Anthony Lawrence O'Brien, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 10 days.

(21) Appl. No.: 10/184,541

(22) Filed: Jun. 28, 2002

(65) Prior Publication Data
US 2003/0001656 A1 Jan. 2, 2003

Related U.S. Application Data

(60) Provisional application No. 60/302,025, filed on Jun. 29, 2001.

(51) Int. Cl.$^7$ ................................. H03M 1/06
(52) U.S. Cl. ................ 341/118; 341/120; 341/136; 341/143
(58) Field of Search ................. 341/118, 120, 341/136, 143, 144, 159, 172

(56) References Cited

U.S. PATENT DOCUMENTS 5,373,294 A * 12/1994 Sun ........................... 341/144
5,394,146 A * 2/1995 Arimoto ..................... 341/118
5,463,394 A * 10/1995 Sun ........................... 341/144
5,541,598 A * 7/1996 Malek-Khosravi .......... 341/118
5,612,696 A * 3/1997 Kim ........................... 341/118
5,825,317 A * 10/1998 Anderson et al. ........... 341/118
5,859,606 A * 1/1999 Schrader et al. ............ 341/144

* cited by examiner

Primary Examiner—Michael Tokar
Assistant Examiner—Lam T. Mai
(74) Attorney, Agent, or Firm—Iandiorio & Teska

(57) ABSTRACT

"A compensating circuit for use in a switch circuit comprising scaled current steering switches, a switch circuit comprising the compensating circuit, and a method for minimising time-skew in switching scaled current steering switches"

An eight bit current steering DAC comprising scaled current steering switches ($S_{T0}, S_{F0}, S_{T(n-1)}, S_{F(n-1)}$) (where n=8) comprises a comprising plurality of compensating MOS switches ($S_{CT0}$ and $S_{CF0}$ to $S_{CT(n-1)}$ for minimising time-skew when switching selected ones of the current steering switches from one state to another. The compensating switches ($S_{CT}, S_{CF}$) are of type similar to the current steering switches ($S_{Ti}$ and $S_{Fi}$), and are sized so that the combined switching load presented to the corresponding driver circuit ($D_i$) by the sum of the parasitic load capacitance of the current steering switch ($S_{Ti}$ or $S_{Fi}$) and the corresponding compensating switch ($S_{CTi}$ or $S_{CFi}$) is substantially similar for each driver circuit ($D_i$). Thereby, selected current steering switches ($S_{T0}$ and $S_{F0}$ to $S_{T(n-1)}$ and $S_{F(n-1)}$) are simultaneously switched in response to simultaneously applied switching signals from the driver circuits ($D_i$).

40 Claims, 7 Drawing Sheets

| Column 1 | Column 2 | | Column 3 | | Column 4 |
|---|---|---|---|---|---|
| Bit number | Scaled Current Steering Switches | | Scaled Load Compensating switches | | Total Combined Switch Size Proportional to Switching Load |
| | Switch | Size | Switch | Size | |
| 0 LSB | $S_{T0}$ | 1 | $S_{CT0}$ | 128 | 129 |
| 1 | $S_{T1}$ | 2 | $S_{CT1}$ | 127 | 129 |
| 2 | $S_{T2}$ | 4 | $S_{CT2}$ | 125 | 129 |
| 3 | $S_{T3}$ | 8 | $S_{CT3}$ | 121 | 129 |
| 4 | $S_{T4}$ | 16 | $S_{CT4}$ | 113 | 129 |
| 5 | $S_{T5}$ | 32 | $S_{CT5}$ | 97 | 129 |
| 6 | $S_{T6}$ | 64 | $S_{CT6}$ | 65 | 129 |
| 7 MSB | $S_{T7}$ | 128 | $S_{CT7}$ | 1 | 129 |

Fig. 3

| Column 1 | Column 2 | | Column 3 | | Column 4 | | Column 5 |
|---|---|---|---|---|---|---|---|
| Bit number | Scaled Current Steering Switches | | Coupling Compensating Switches | | Scaled Load Compensating switches | | Total Combined Switch Size Proportional to Switching Load |
| | Switch | Size | Switch | Size | Switch | Size | |
| 0 LSB | $S_{T0}$ | 1 | $S_{CCT0}$ | 0.5 | $S_{CT0}$ | 191.5 | 193 |
| 1 | $S_{T1}$ | 2 | $S_{CCT1}$ | 1 | $S_{CT1}$ | 190 | 193 |
| 2 | $S_{T2}$ | 4 | $S_{CCT2}$ | 2 | $S_{CT2}$ | 187 | 193 |
| 3 | $S_{T3}$ | 8 | $S_{CCT3}$ | 4 | $S_{CT3}$ | 181 | 193 |
| 4 | $S_{T4}$ | 16 | $S_{CCT4}$ | 8 | $S_{CT4}$ | 169 | 193 |
| 5 | $S_{T5}$ | 32 | $S_{CCT5}$ | 16 | $S_{CT5}$ | 145 | 193 |
| 6 | $S_{T6}$ | 64 | $S_{CCT6}$ | 32 | $S_{CT6}$ | 97 | 193 |
| 7 MSB | $S_{T7}$ | 128 | $S_{CCT7}$ | 64 | $S_{CT7}$ | 1 | 193 |

Fig. 9

| Column 1 | Column 2 | | Column 3 | | Column 4 | | Column 5 |
|---|---|---|---|---|---|---|---|
| | Scaled Current Steering Switches | | Coupling Compensating Switches | | Scaled Load Compensating switches | | Total Combined Switch Size Proportional to Switching Load |
| Bit number | Switch | Size | Switch | Size | Switch | Size | |
| 0  LSB | $S_{T0}$ | 1 | $S_{CCT0}$ | 0.5 | $S_{CT0}$ | 47.5 | 49 |
| 1 | $S_{T1}$ | 2 | $S_{CCT1}$ | 1 | $S_{CT1}$ | 46 | 49 |
| 2 | $S_{T2}$ | 4 | $S_{CCT2}$ | 2 | $S_{CT2}$ | 43 | 49 |
| 3 | $S_{T3}$ | 8 | $S_{CCT3}$ | 4 | $S_{CT3}$ | 37 | 49 |
| 4 | $S_{T4}$ | 16 | $S_{CCT4}$ | 8 | $S_{CT4}$ | 25 | 49 |
| 5 | $S_{T5}$ | 32 | $S_{CCT5}$ | 16 | $S_{CT5}$ | 1 | 49 |
| 6 | $S_{T6a}$ | 32 | $S_{CCT6a}$ | 16 | $S_{CT6a}$ | 1 | 49 |
| | $S_{T6b}$ | 32 | $S_{CCT6b}$ | 16 | $S_{CT6b}$ | 1 | 49 |
| 7  MSB | $S_{T7a}$ | 32 | $S_{CCT7a}$ | 16 | $S_{CT7a}$ | 1 | 49 |
| | $S_{T7b}$ | 32 | $S_{CCT7b}$ | 16 | $S_{CT7b}$ | 1 | 49 |
| | $S_{T7c}$ | 32 | $S_{CCT7c}$ | 16 | $S_{CT7c}$ | 1 | 49 |
| | $S_{T7d}$ | 32 | $S_{CCT7d}$ | 16 | $S_{CT7d}$ | 1 | 49 |

Fig. 10

COMPENSATING CIRCUIT FOR USE IN A SWITCH CIRCUIT COMPRISING SCALED CURRENT STEERING SWITCHES, A SWITCH CIRCUIT COMPRISING THE COMPENSATING CIRCUIT, AND A METHOD FOR MINIMISING TIME-SKEW IN SWITCHING SCALED CURRENT STEERING SWITCHES

This application claims the benefit of Provisional Application No. 60/302,025 filed Jun. 29, 2001.

FIELD OF THE INVENTION

The present invention relates to switch circuits comprising a plurality of scaled current steering switches which are selectively operable from one state to another in response to switching signals, and in particular, the invention relates to such a switch circuit in which time-skew resulting from failure of selected ones of the current steering switches to simultaneously switch from one state to the other in response to simultaneously applied switching signals is minimised. In particular, the invention relates to a compensating circuit for use with such a switch circuit for minimising time-skew. The invention also relates to a current steering digital to analogue converter (DAC) incorporating the compensating circuit. The invention also relates to a method for minimising time-skew in the selective switching of a plurality of scaled current steering switches from one state to another in response to respective simultaneously applied switching signals.

BACKGROUND OF THE INVENTION

In current steering DACs digital data is converted into an equivalent analogue output current which corresponds to the digital word being converted. The analogue current is derived from the sum of the currents from a plurality of binarily weighted current sources, which are weighted to correspond to the bits of the digital word from the least significant bit (LSB), to the most significant bit (MSB). In the conversion process the currents from the current sources corresponding to the bits of the digital word are steered into summing nodes, one node representing true data bits, and one node representing false data bits. The summing nodes are terminated with respective terminating resistors, and the summed currents are converted into output voltages developed across the respective terminating resistors.

It is important that non-linearities between the digital data inputted to such a DAC, and the analogue output be kept to a minimum. Such non-linearities originate from errors in the weighting ratios of the analogue currents, and from dynamic errors arising from the steering of the currents into the respective nodes in response to the digital data. In practical implementations of current steering DACs the currents from the current sources are switched to the summing nodes through current steering analogue switches, which in an integrated circuit are typically MOS transistor switches. The switches, in general, are provided as dual switch pairs, one dual switch pair being provided for each current source. The switches are scaled in size in proportion to the current to be switched from the corresponding current sources. The dual switch pairs are responsive to switching signals which are in turn responsive to the corresponding individual digital data bits. One of the switches of each dual switch pair is responsive to a true signal, and the other is responsive to a false signal. It is important that the "on" voltage across the switches for steering the currents from the current sources which is given by the following equation should be constant:

$$V_{SW} = I_0 \cdot 2^i \cdot R_{oni} = \text{constant}$$

where $I_0$ represents the current of the current source corresponding to the LSB, i represents the bit, from bit i=0 (LSB) to bit i=n−1 (MSB), and $R_{oni}$ represents the on resistance of the switch corresponding to bit i.

In MOS transistor switches the on resistance ($R_{on}$) is inversely proportional to the geometric size of the switch, and thus from the above equation for the switch voltage $V_{SW}$ the MOS transistor switch for switching the current sources corresponding to the respective bit i must be of size $2^i$ times the size of the MOS transistor switch for switching the LSB. Thus, in an n bit DAC each MOS switch of the dual switch pair for switching the current of the current source corresponding to the MSB must be of size $2^{n-1}$ times the size of one of the MOS switches of the dual switch pair for switching the current source corresponding to the LSB, and so on for the switches of the dual switch pairs corresponding to the bits $2^{n-2}$, $2^{n-3}$, and so on.

The size of a MOS transistor switch is determined by the area of the switch, which in turn is determined by the length and width of the switch. The length is determined by the distance between the source and the drain of the switch, and the width is determined by the width of the source and drain, this will be well known to those skilled in the art.

The MOS current steering switches are switched in response to the respective corresponding bits of the digital data word. Respective driver circuits corresponding to the dual switch pairs output appropriate true and false switching signals in response to the digital data word for selectively switching the switches of the dual switch pairs. The switching signals are applied to the gates of the corresponding MOS switches of the dual switch pairs, for appropriately switching the switches. The switching load presented by a MOS switch to a corresponding driver circuit is a capacitive load, and is proportional to the switch size, and thus, the switching load presented to the driver circuits by the respective MOS switches are scaled in proportion to the scaling of the MOS switches. The capacitive switching load results from parasitic capacitance between the gate and the source and the gate and the drain, respectively, of the MOS switch, and also between the gate and the silicon of the MOS switch which is referred to as bulk capacitance.

Digital data samples are received by a DAC from a data register which is clocked at a constant rate, and thus, each digital data word is provided to the driver circuits simultaneously, and the switching signals, which are derived from the digital data word by the driver circuits are similarly provided by the driver circuits to the switches simultaneously. However, due to the fact that the switching loads presented to the respective driver circuits by their corresponding MOS switches differ due to the scaling of the switches, the switches are not simultaneously switched. This leads to time-skewing during switching of the MOS switches, which in turn leads to inter-symbol-interference and harmonic distortion. This type of distortion can become dominant for high data sampling rates which are common in DACs, and also in direct digital synthesisers.

Time-skew of the analogue output signal can be readily understood with reference to FIG. 1 which illustrates the timing performance of a typical prior art n bit DAC. Waveform ($A_{LSB}$) represents the output from the LSB register in response to a data word, and waveform ($A_{MSB}$) represents the output of the MSB register in response to the data word. At time $t_0$ both $A_{LSB}$ and $A_{MSB}$ go high. Waveform $B_{LSB}$ represents the output voltage of the switching signal of the driver circuit of the MOS switch corresponding to the LSB, while waveform $B_{MSB}$ represents the output voltage of the switching signal of the driver circuit of the MOS switch corresponding to the MSB. Waveform $C_{LSB}$ represents the state of the MOS switch corresponding to the LSB, while waveform $C_{MSB}$ represents the state of the MOS switch corresponding to the MSB. Waveform $D_{LSB}$ represents the current $I_0$ flowing through the MOS switch corresponding to the LSB, while waveform $D_{MSB}$ represents the current flowing through the MOS switch corresponding to the MSB. The current waveform $D_{MSB}$ corresponding to the MSB which is $I_0 \cdot 2^{(n-1)}$ is not to scale.

At time $t_0$ the output from the LSB register and from the MSB register both go high simultaneously. Due to the capacitive switching load presented by the respective MOS switches corresponding to the LSB and the MSB to their corresponding driver circuits there is a time delay before the voltages of the switching signals from the driver circuits reach a level sufficient for switching the corresponding MOS switches. Due to the higher capacitive load presented by the MOS switch corresponding to the MSB than that presented by the MOS switch corresponding to the LSB, the time delay in switching the MOS switch corresponding to the MSB is greater than that for switching the MOS switch corresponding to the LSB. The MOS switch corresponding to the LSB switches from one state to the other at time $t_{DLSB}$, while the MOS switch corresponding to the MSB switches from one state to the other at time $t_{DMSB}$. Thus, the difference in the two time delays is $\Delta t$ which is equal to $t_{DMSB}-t_{DLSB}$. Waveform E represents a summation (not to scale) of the currents through the MOS switches corresponding to the MSB and the LSB. The distortion due to the time delay $\Delta t$ in switching is illustrated by the portion of the waveform between the points X and Y of waveform E during the switching time delay $\Delta t$. Similar time-skewing occurs when the respective LSB and MSB outputs from the register go low. Although the currents for the bits 1 to n-2 have not been illustrated, similar time-skewing as a result of non-simultaneous switching of the corresponding MOS switches occurs in the analogue currents corresponding to all the bits.

In order to minimise dynamic errors due to time-skewing, driver circuits for switching the MOS switches in response to the digital data bits are commonly scaled to take account of the variation of the switching load presented by the respective MOS switches. However, the scaling range that can be implemented in driver circuits due to the general combined requirement to minimise time-skew and to achieve suitable fast switch control signal transitions is significantly limited. A further constraint arises due to the fact that the level of the switching signals must be adjusted to optimise the switching operation between switches responding to true and false data bits. Such optimisation may be contrary to the optimum driver scaling for some bits. In practice, known prior art methods for reducing time-skew fail to eliminate timing errors between switches responding to higher order data bits, namely, those in the MSBs range, and those responding to lower order bits, namely, those in the LSBs range.

Similar problems arise in other circuits where scaled analogue switches are provided for switching currents from scaled current sources.

Accordingly, there is therefore a need for a circuit which overcomes these problems. There is also a need for a DAC in which errors resulting from time-skewing are minimised, and there is a need for a method for minimising time-skewing in the selective switching of a plurality of scaled analogue switches from one state to another.

The present invention is directed towards providing such a circuit, a DAC and a method.

SUMMARY OF THE INVENTION

According to the invention there is provided a compensating circuit for providing switching load compensation for a plurality of scaled current steering switches selectively operable from one state to another state in response to respective switching signals, the compensating circuit comprising a scaled load compensating circuit for providing scaled switching load compensation for at least some of the current steering switches so that the switching loads presented to driver circuits of the respective current steering switches for switching thereof are substantially similar, thereby facilitating substantially simultaneous switching of selected ones of the switches from one of the states to the other state in response to simultaneously applied switching signals.

In one embodiment of the invention the compensating circuit comprises the driver circuits, and the driver circuits are substantially similar to each other.

In another embodiment of the invention the scaled load compensating circuit comprises a plurality of load compensating elements, one load compensating element being provided corresponding to each current steering switch for which switching load compensation is to be provided, the values of the switching load compensation provided by the respective load compensating elements being such that when combined with the switching load of the corresponding current steering switch, the combined switching load presented to the corresponding driver circuit is substantially similar for each current steering switch and its corresponding load compensating element.

In a further embodiment of the invention each load compensating element comprises a load compensating switch, the switching load compensation being derived from the switching load of the load compensating switch.

Preferably, each load compensating switch is of similar type to that of the corresponding current steering switch.

Advantageously, the load compensating switches are scaled so that the switching load compensation provided by the respective load compensating switches is complementary to the switching loads of the current steering switches.

In one embodiment of the invention the load compensating switch presenting the largest switching load compensation corresponds to the current steering switch presenting the smallest switching load for which switching load compensation is to be provided, and the load compensating switch presenting the smallest switching load compensation corresponds to the current steering switch presenting the largest switching load for which switching load compensation is to be provided.

Advantageously, the load compensating switches are binarily scaled in descending order for compensating for current steering switches which are binarily scaled in ascending order.

In one embodiment of the invention each load compensating switch is a non-load switching switch.

In another embodiment of the invention a load correcting element associated with each load compensating switch is provided for correcting for the difference between an ideal switching load of the corresponding load compensating switch if the load compensating switch were switching a load, and the actual switching load compensation provided by the load compensating switch. Preferably, each load compensating element provides capacitive switching load compensation.

In another embodiment of the invention a coupling compensating element is provided for at least some of the current steering switches for compensating for distortion resulting from switching signal coupling effects. Preferably, each coupling compensating element comprises a coupling compensating switch, and the coupling compensation is derived from the parasitic capacitance of the coupling compensating switch between the gate of the switch and the source and drain thereof. Advantageously, the source and drain of each coupling compensating switch are electrically connected together.

Additionally the invention provides a switch circuit comprising:

a plurality of scaled current steering switches selectively operable from one state to another state in response to respective switching signals, and a scaled load compensating circuit for providing scaled switching load compensation for at least some of the current steering switches so that the switching loads presented to driver circuits of the respective current steering switches for switching thereof are substantially similar, thereby facilitating substantially simultaneous switching of selected ones of the switches from one of the states to the other state in response to simultaneously applied switching signals.

In one embodiment of the invention the switching circuit comprises the driver circuits, and the driver circuits are substantially similar to each other.

In another embodiment of the invention one load compensating element is provided for each current steering switch.

In another embodiment of the invention the switching circuit is implemented in an integrated circuit, and each current steering switch is a MOS switch, having a capacitive switching load, and each load compensating element providing a capacitive switching load compensation.

In another embodiment of the invention the current steering switches are provided in switch pairs, and the load compensating elements are provided in corresponding pairs.

Further the invention provides a current steering digital to analogue converter comprising:

a plurality of binarily scaled current steering switches operable from one state to another state in response to switching signals for selectively switching currents through selected ones of the current steering switches to a common node, and a scaled load compensating circuit for providing scaled switching load compensation for at least some of the current steering switches so that the switching loads presented to driver circuits of the respective current steering switches for switching thereof are substantially similar, thereby facilitating substantially simultaneous switching of selected ones of the current steering switches from one of the states to the other state in response to the simultaneously applied switching signals.

In one embodiment of the invention the digital to analogue converter comprises the driver circuits, and the driver circuits are substantially similar to each other.

The invention also provides a method for minimising time-skew in the selective switching of a plurality of current steering switches from one state to another state in response to respective simultaneously applied switching signals, the method comprising the step of providing scaled load compensation for at least some of the current steering switches so that the switching loads presented to driver circuits of the respective current steering switches are substantially similar, thereby facilitating substantially simultaneous switching of selected ones of the current steering switches from one of the states to the other state in response to the simultaneously applied switching signals.

In one embodiment of the invention the driver circuits are provided to be substantially similar to each other.

In another embodiment of the invention one load compensating element is provided for each current steering switch. Preferably, each load compensating element is provided by a load compensating switch, the switching load compensation being derived from the switching load of the load compensating switch.

ADVANTAGES OF THE INVENTION

The advantages of the invention are many. By virtue of the fact that the switching loads presented to the driver circuits of the current steering switches are substantially similar, the selected ones of the current steering switches are simultaneously switched in response to the switching signals. Thus, time-skew in the analogue current output of the switching circuit is avoided. This is a particularly important advantage in current steering DACs, and in particular, in high speed current steering DACs, although, needless to say, the advantages of the invention may be achieved in any circuit which comprises scaled current steering switches. These advantages are achieved by virtue of the fact that the provision of the load compensating circuit ensures that the switching loads presented to the driver circuits of the respective current steering switches are substantially similar, and therefore, the driver circuits themselves can also be substantially similar to each other. This ensures that the selected ones of the current steering switches are simultaneously switched in response to the switching signals.

Additionally, by virtue of the fact that the switching loads of the current steering switches are compensated for such that the switching load presented to the respective driver circuits are similar, distortion in the analogue output resulting from coupling errors can more easily be corrected.

These and other advantages of the invention will be readily apparent to those skilled in the art from the following description of some preferred embodiments thereof, which are given by way of example only, with reference to the accompanying drawings.

BRIEF DESCRIPTION OF THE DRAWINGS

FIG. 3 illustrates a table setting out sizes of switch components of an eight bit current steering DAC of the type of the DAC of FIG. 2, FIG. 4 is a graphical representation of the switching characteristics of the DAC of FIG. 2, FIG. 9 illustrates a table showing sizes of switch components of the DAC of FIG. 8, and FIG. 10 illustrates a table showing switch sizes for a segmented eight bit DAC according to another embodiment of the invention showing sizes of switch components of the DAC.

DETAILED DESCRIPTION OF THE INVENTION

Figure 2:
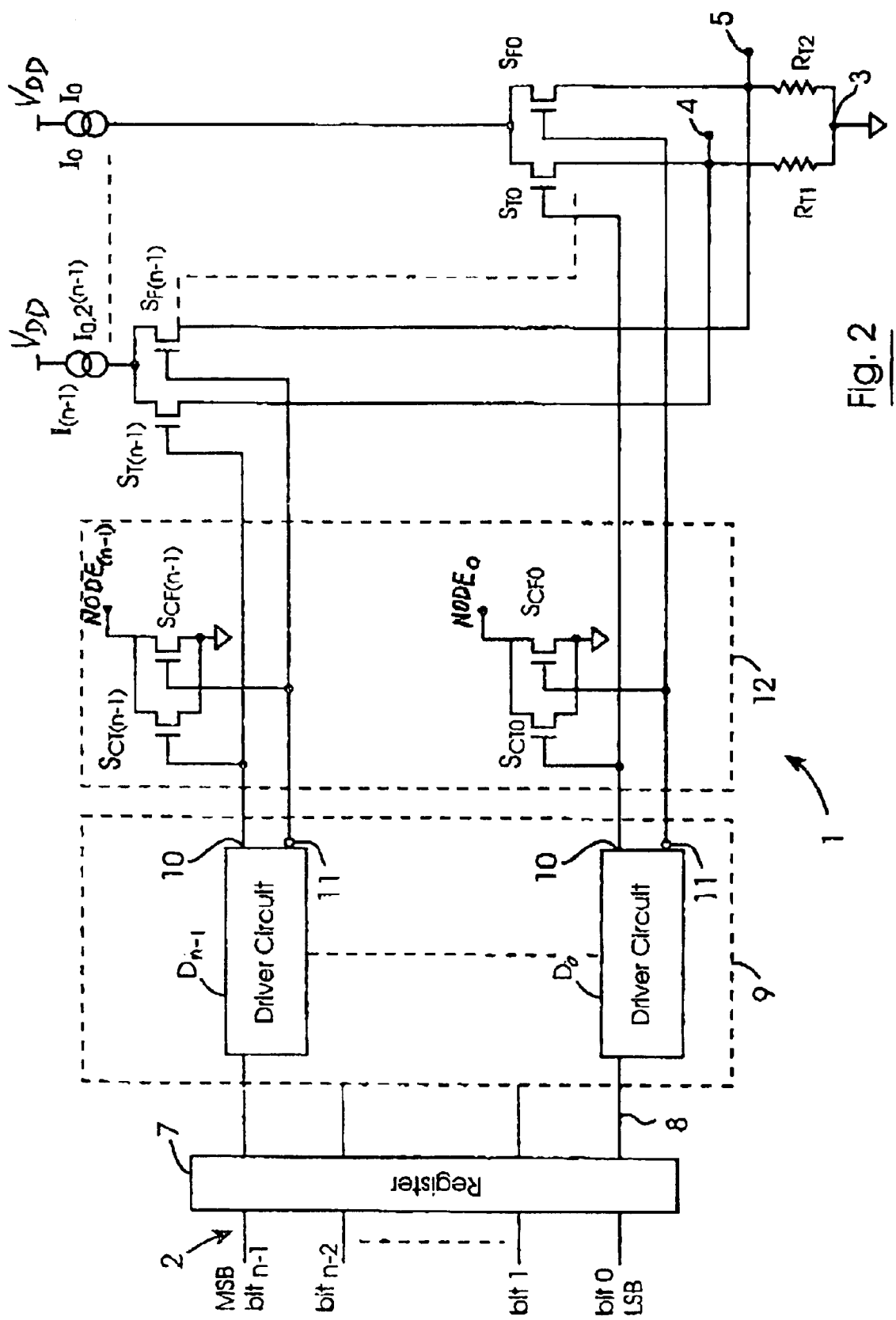
FIG. 2 is a circuit diagram of a current steering DAC according to the invention.

Referring to the drawings and initially to FIG. 2, there is illustrated a current steering DAC according to the invention, indicated generally by the reference numeral 1, for sequentially converting digital data words received on an n-bit bus 2 to analogue voltage outputs. The current steering DAC 1 is implemented as an integrated circuit. The analogue voltage outputs are developed across terminating resistors $R_{T1}$ and $R_{T2}$, which are connected between a common node 3, typically ground, and output summing nodes 4 and 5, respectively. The DAC 1 comprises a plurality of binarily scaled current sources, namely, $I_0$ to $I_{n-1}$. The current source $I_0$ provides a current $I_0$ corresponding to the LSB, namely, bit 0 of the digital data word, and the current source $I_{n-1}$ provides a current $I_{n-1}$ corresponding to the MSB of the digital data word, namely, bit n–1. The value of the current from the current source $I_{n-1}$ is $I_0.2^{n-1}$. Current sources $I_1$, $I_2$, to current source $I_{n-2}$ are also provided, and these are likewise binarily scaled, current source $I_1$ providing a current $I_1$ corresponding to the second LSB, namely, bit 1 of value $I_0.2^1$, the current source $I_2$ providing a current $I_2$ corresponding to the third LSB, namely, bit 2 of value $I_0.2^2$. Similarly, the current source $I_{n-2}$ corresponding to the second MSB, namely, bit n–2 provides a current $I_{n-2}$ of value $I_0.2^{n-2}$. Dual pair MOS transistor current steering analogue switches $S_{T0}$ to $S_{T(n-1)}$ and $S_{F0}$ to $S_{F(n-1)}$ which are responsive to respective true bit switching signals and false bit switching signals, respectively, are provided for switching the currents from the current sources $I_0$ to $I_{n-1}$, respectively, to the respective output summing nodes 4 and 5. The current steering switch pairs $S_{T0}$ and $S_{F0}$ to $S_{T(n-1)}$ and $S_{F(n-1)}$ are scaled in size such that the current steering switches $S_{T(n-1)}$ and $S_{F(n-1)}$ are $2^{n-1}$ times the size of the corresponding current steering switches $S_{T0}$ and $S_{F0}$, respectively. The sizes of the current steering switches $S_{T0}$ and $S_{F0}$ are identical to each other, and the sizes of the current steering switches $S_{T(n-1)}$ and $S_{F(n-1)}$ are therefore also identical to each other. The dual pair current steering switches $S_{T1}$ and $S_{F1}$ to $S_{T(n-2)}$ and $S_{F(n-2)}$ are similarly scaled so that the size of each current steering switch $S_{Ti}$ or $S_{Fi}$ is equal to $2^i$ times the size of either of the current steering switches $S_{T0}$ or $S_{F0}$ where the switches $S_{Ti}$ and $S_{Fi}$ are the switches for switching the currents from the current source $I_i$ corresponding to the ith bit of the data word. Such current steering DACs with scaled current sources $I_0$ to $I_0.2^{n-1}$ and scaled current switches $S_{T0}$ and $S_{F0}$ to $S_{T(n-1)}$ and $S_{F(n-1)}$ will be well known to those skilled in the art.

Digital data words are clocked on the bus 2 to a register 7. An n bit bus 8 relays the bits of the digital word to a switching signal generating circuit 9, which comprises driver circuits $D_0$ to $D_{n-1}$, which correspond to the dual switch pairs $S_{T0}$ and $S_{F0}$ to $S_{T(n-1)}$ and $S_{F(n-1)}$, respectively. The driver circuits $D_0$ to $D_{n-1}$ in response to the bits bit 0 to bit n–1 clocked into the register 7 output appropriate true and false switching signals corresponding to bits 0 to n–1, respectively, of each data word to the current steering switches $S_{T0}$ and $S_{F0}$ to $S_{T(n-1)}$ and $S_{F(n-1)}$, respectively, for appropriately switching the current steering switches. The true switching signals are outputted on outputs 10 of the driver circuits $D_0$ to $D_{n-1}$ to the corresponding current steering switches $S_{T0}$ to $S_{Tn-1}$, respectively, while the false switching signals are outputted on outputs 11 of the driver circuits $D_0$ to $D_{n-1}$ to the corresponding current steering switches $S_{F0}$ to $S_{F(n-1)}$, respectively. However, as discussed above, since the current steering switches $S_{Ti}$ and $S_{Fi}$ are MOS switches they present a capacitive switching load to the corresponding driver circuit $D_i$, and the capacitive switching load presented by the respective current steering switches $S_{Ti}$ and $S_{Fi}$ increases in proportion to their size.

In order to minimise time-skew in the analogue voltage outputs developed across the terminating resistors $R_{T1}$ and $R_{T2}$, a scaled load compensating circuit 12 is provided in the DAC 1. The scaled load compensating circuit 12 comprises a plurality of load compensating elements which in this embodiment of the invention are provided by dual pair load compensating switches $S_{CT0}$ and $S_{CF0}$ to $S_{CT(n-1)}$ to $S_{CF(n-1)}$, which correspond to the current steering switches $S_{T0}$ and $S_{F0}$ to $S_{T(n-1)}$ and $S_{F(n-1)}$, respectively. The corresponding switches $S_{CT0}$ and $S_{CF0}$ to $S_{CT(n-1)}$ and $S_{CF(n-1)}$ are analogue MOS transistor switches of similar type to the MOS switches $S_{T0}$ and $S_{F0}$ to $S_{T(n-1)}$ and $S_{F(n-1)}$, and the gates of the compensating switches $S_{CTi}$ and $S_{CFi}$ are connected to the corresponding output 10 and 11 of the corresponding driver circuit $D_i$ for presenting capacitive compensating switching loads to the driver circuit $D_i$ in addition to the switching loads presented by the current steering switches $S_{Ti}$ and $S_{Fi}$. The drains of the compensating switches $S_{CTi}$ and $S_{CFi}$ are connected to ground, and the sources of each pair of compensating switches $S_{CTi}$ and $S_{CFi}$ are connected to a corresponding floating node $NODE_i$. In other words, floating nodes $NODE_0$ to $NODE_{(n-1)}$ are provided for the pairs of compensating switches $S_{CT0}$ and $S_{CF0}$ to $S_{CT(n-1)}$ and $S_{CF(n-1)}$, respectively. However, the compensating switches $S_{CTi}$ and $S_{CFi}$ do not switch currents.

The compensating switches $S_{CTi}$ and $S_{CFi}$ are scaled in size so that the combined switching load presented to the corresponding driver circuit $D_i$ by the current steering switch $S_{Ti}$ and the corresponding compensating switch $S_{CTi}$ on the one hand, and the combined switching load presented to the driver circuit $D_i$ by the current steering switch $S_{Fi}$ and the corresponding compensating switch $S_{CFi}$ on the other hand, are substantially similar, and are substantially similar for each combination of current steering switch of each dual switch pair and its corresponding compensating switch. Accordingly, the driver circuits $D_0$ to $D_{n-1}$ are each presented with a similar switching load from the combination of the corresponding compensating switch $S_{CTi}$ and the current steering switch $S_{Ti}$, and from the corresponding compensating switch $S_{CFi}$ and the current steering switch $S_{Fi}$. Thus, the selected switches of the switches $S_{T0}$ and $S_{F0}$ to $S_{T(n-1)}$ and $S_{F(n-1)}$ are substantially simultaneously switched from one state to the other state in response to a digital word clocked into the register 7. This is described in more detail below with reference to FIG. 4. However, before describing the simultaneous switching of the selected ones of the current steering switches $S_{T0}$ and $S_{F0}$ to $S_{T(n-1)}$ and $S_{F(n-1)}$ with reference to FIG. 4 the sizing of the compensating switches $S_{CTi}$ and $S_{CFi}$ relative to their corresponding switches $S_{Ti}$ and $S_{Fi}$ will first be described with reference to FIG. 3.

In describing the sizing of the compensating switches $S_{CTi}$ and $S_{CFi}$ with reference to FIG. 3, the DAC 1 is assumed to be an eight bit DAC, and for convenience the sizing of the compensating switches $S_{CTi}$ relative to the switches $S_{Ti}$ will be described. The sizing of the switches $S_{CFi}$ relative to the switches $S_{Fi}$ will be similar. In the table of FIG. 3, column 1 represents the bit number of the digital data word from the LSB bit 0 to the MSB, namely, bit 7. The sizes of the corresponding current steering switches $S_{T0}$ to $S_{T(n-1)}$, namely, switches $S_{T0}$ to $S_{T7}$ are set out in column 2. The current steering switch $S_{T0}$ which corresponds to the LSB is assumed to have a switch size of unity, namely, $2^0$. The current steering switch $S_{Ti}$ which corresponds to the second LSB, namely, bit 1 has a switch size $2^1$ times the size of the current steering switch $S_{T0}$, namely, twice the size of the switch $S_{T0}$. The current steering switch $S_{T2}$ which corresponds to the third LSB, namely, bit 2 has a switch size $2^2$ times the size of current steering switch $S_{T0}$, namely, four times the size of the switch $S_{T0}$, and so on up to current steering switch $S_{T7}$ which corresponds to bit 7, namely, the MSB, and has a switch size of $2^7$ times the size of switch $S_{T0}$. Thus, the current steering switch $S_{T7}$ is 128 times the size of switch $S_{T0}$.

Accordingly, in order that the switching load presented to each of the driver circuits $D_0$ to $D_7$ are substantially similar, the compensating switches $S_{CT0}$ to $S_{CT7}$ are scaled relative to the current steering switches $S_{T0}$ to $S_{T7}$ so that the compensating switching loads presented by the compensating switches $S_{CT0}$ to $S_{CT7}$ are complementary to the corresponding current steering switches $S_{T0}$ to $S_{T7}$. The sizes of the compensating switches $S_{CT0}$ to $S_{CT7}$ are set out in column 3 of the table of FIG. 3. The compensating switch $S_{CT0}$ is of size $2^7$ times the size of current steering switch $S_{T0}$, and is thus 128 times the size of switch $S_{T0}$. Thus, the combined sizes of the compensating switch $S_{CT0}$ and the current steering switch $S_{T0}$ is 129 times the size of the current steering switch $S_{T0}$. Since the current steering switch $S_{T7}$ is $2^7$ times the size of the current steering switch $S_{T0}$, the compensating switch $S_{CT7}$ is $2^0$ times the size of the current steering switch $S_{T0}$. Thus, the combined sizes of the compensating switch $S_{CT7}$ and the current steering switch $S_{T7}$ is 129 times the size of the current steering switch $S_{T0}$. Therefore, the combined switching load presented to the driver circuit $D_0$ by the current steering switch $S_{T0}$ and the compensating switch $S_{CT0}$ is 129 times the switching load which would be presented by the current steering switch $S_{T0}$. Additionally, the combined switching load presented to the driver circuit $D_7$ by the current steering switch $S_{T7}$ and the compensating switch $S_{CT7}$ is 129 times the switching load which would be presented by the current steering switch $S_{T0}$, and therefore the switching loads presented to the driver circuits $D_0$ and $D_7$ are identical.

The compensating switches $S_{CT1}$ to $S_{CT6}$ are sized so that the combined switching load presented to each driver circuit $D_1$ to $D_6$ is similarly 129 times the size of the switching load which would be presented by the current steering switch $S_{T0}$. This is achieved by selecting the size of the compensating switches $S_{CT1}$ to $S_{CT6}$ as set out in column 3 of the table of FIG. 3. The compensating switch $S_{CT1}$ is of size 127 times that of the current steering switch $S_{T0}$, while the size of the compensating switch $S_{T2}$ is 125 times the size of the current steering switch $S_{T0}$ and so on to the compensating switch $S_{CT6}$ which is of size 65 times that of the current steering switch $S_{T0}$.

Accordingly, since the combined sizes of the current steering switches and their respective corresponding compensating switches are similar for each bit of the digital data word, the switching load presented to the corresponding driver circuits $D_0$ to $D_7$ are substantially similar, and therefore the respective selected switches $S_{T0}$ to $S_{T7}$ are simultaneously switched by corresponding switching signals from the corresponding driver circuits $D_0$ to $D_7$ in response to the corresponding data bits of the data word.

Similarly, the compensating switches $S_{CFi}$ corresponding to the current steering switches $S_{Fi}$ are similarly sized to correspond with the sizes of the corresponding compensating switches $S_{CTi}$. Accordingly, the switching load presented by the combined current steering switch $S_{Fi}$ and its corresponding compensating switch $S_{CFi}$ to the corresponding driver circuit $D_i$ is 129 times the switching load of the current steering switch $S_{T0}$, and thus all selected switches $S_{T0}$ and $S_{F0}$ to $S_{T(n-1)}$ and $S_{F(n-1)}$ are simultaneously switched from one state to the other in response to the data bits of a data word clocked into the data register 7.

Figure 5:
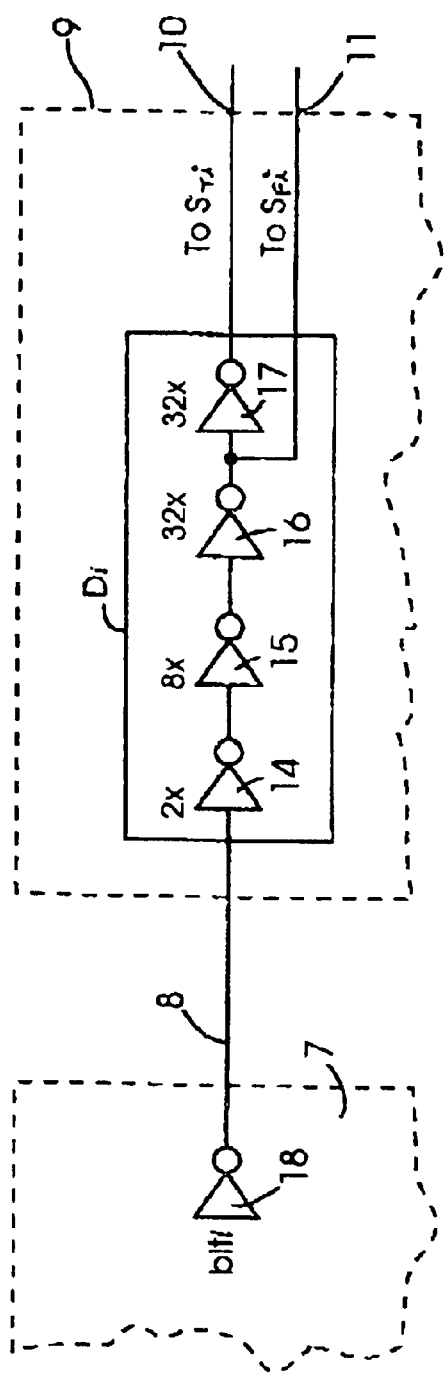
FIG. 5 is a circuit diagram of a part of the DAC of FIG. 2.

Referring now to FIG. 5, by virtue of the fact that the switching load presented to each of the driver circuits $D_0$ to $D_{(n-1)}$ are similar, the driver circuits $D_0$ to $D_{(n-1)}$ can likewise be similar. FIG. 5 illustrates an example of a typical driver circuit for switching the current steering switches $S_{Ti}$ and $S_{Fi}$ of the DAC 1. The driver circuit $D_i$ comprises four inverters, namely, a first inverter 14, a second inverter 15, a third inverter 16 and a fourth inverter 17. The output from the register 7 is outputted through an inverter 18 of size 1×. The first inverter 14 in the driver circuit Di is of size 2×, namely, twice the size of the inverter 18 in the register 7. The second inverter 15 is eight times the size of the inverter 18 in the register 7, while the third inverter 16 is thirty-two times the size of the inverter 18 in the register 7. The fourth inverter 17 is also thirty-two times the size of the inverter 18 in the register 7. The respective true and false switching signals are outputted to the current steering switches $S_{Ti}$ and $S_{Fi}$ from the fourth inverter 17 and the third inverter 16, respectively, of the driver circuit $D_i$.

Figure 1:
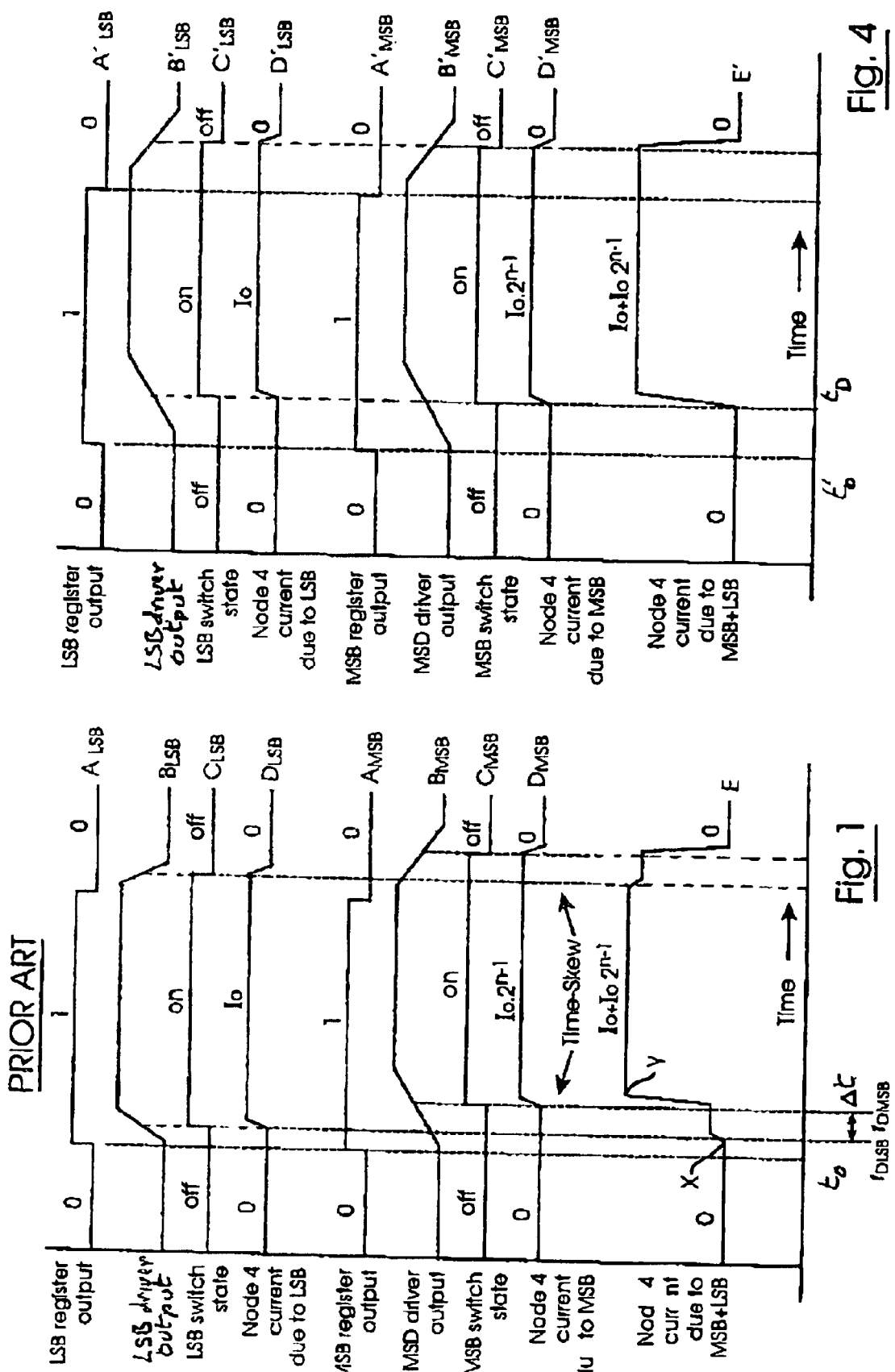
FIG. 1 is a graphical representation of the switching characteristics of a prior art current steering DAC.

Referring now to FIG. 4, a switch timing performance diagram similar to that of FIG. 1 illustrates the timing of the true current steering switches of the DAC 1 according to the invention corresponding to the LSB and the MSB of the digital data word, namely, the switches $S_{T0}$ and $S_{T(n-1)}$. For convenience, the waveforms corresponding to the LSB and the MSB are identified by similar reference letters to those used in FIG. 1 for identifying the waveforms corresponding to the LSB and MSB of FIG. 1, with the addition of a dash, namely, $A'_{LSB}$, $B'_{LSB}$, $C'_{LSB}$ and $D'_{LSB}$ and $A'_{MSB}$ to $D'_{MSB}$. The digital data bits are clocked into the register 7 at time $t'_0$. By virtue of the fact that the driver circuits $D_0$ and $D_{n-1}$ are similar the switching signals outputted by the driver circuits $D_0$ and $D_{n-1}$ are similar, and are of similar voltages; furthermore, by virtue of the fact that the combined switching load presented by the current steering switch $S_{T0}$ and the compensating switch $S_{CT0}$ to the driver circuit $D_0$ is similar to the combined switching load presented by the current steering switch $S_{T(n-1)}$ and the compensating switch $S_{CT(n-1)}$ to the driver circuit $D_{(n-1)}$, the voltages of the switching signals rise at a similar rate, and therefore, the current steering switches $S_{T0}$ and $S_{T(n-1)}$ are simultaneously switched at time $t_D$. There is a slight time delay between the clocking of the digital data word into the register 7 at time $t'_0$ and the switching of the current steering switches $S_{T0}$ and $S_{T(n-1)}$ at time $t_D$. However, most importantly this time delay is constant for the current steering switches $S_{T0}$ and $S_{T(n-1)}$. Accordingly, the summed values of the analogue currents switched by the current steering switches $S_{T0}$ and $S_{T(n-1)}$ which is illustrated by the waveform E is free of time-skewing.

Similar results can be shown when others of the current steering switches $S_{T1}$ to $S_{T(n-2)}$ are switched by their corresponding driver circuits $D_1$ to $D_{(n-2)}$, since all selected switches are simultaneously switched. Likewise, similar results are achieved when the current steering switches $S_{F0}$ to $S_{F(n-1)}$ are switched. In other words, the selected switches of the current steering switches $S_{T0}$ to $S_{T(n-1)}$ and $S_{F0}$ to $S_{F(n-1)}$ are all simultaneously switched.

Similarly, as can be seen in FIG. 4, when the LSB and the MSB go low the respective current steering switches $S_{T0}$ and $S_{T(n-1)}$ are simultaneously switched. A slight time delay occurs between the time the respective LSB and MSB in the register 7 go low and the switches $S_{T0}$ and $S_{T(n-1)}$ are switched, however, the time delay is constant for both switches, and as can be seen from FIG. 4, is substantially similar to the time delay between the clocking of the LSB and the MSB into the register 7 at time $t'_0$, and the switching of the respective current steering switches $S_{T0}$ and $S_{T(n-1)}$ at time $t_D$.

However, it will be appreciated that the two time delays may be different to each other.

Figure 6:
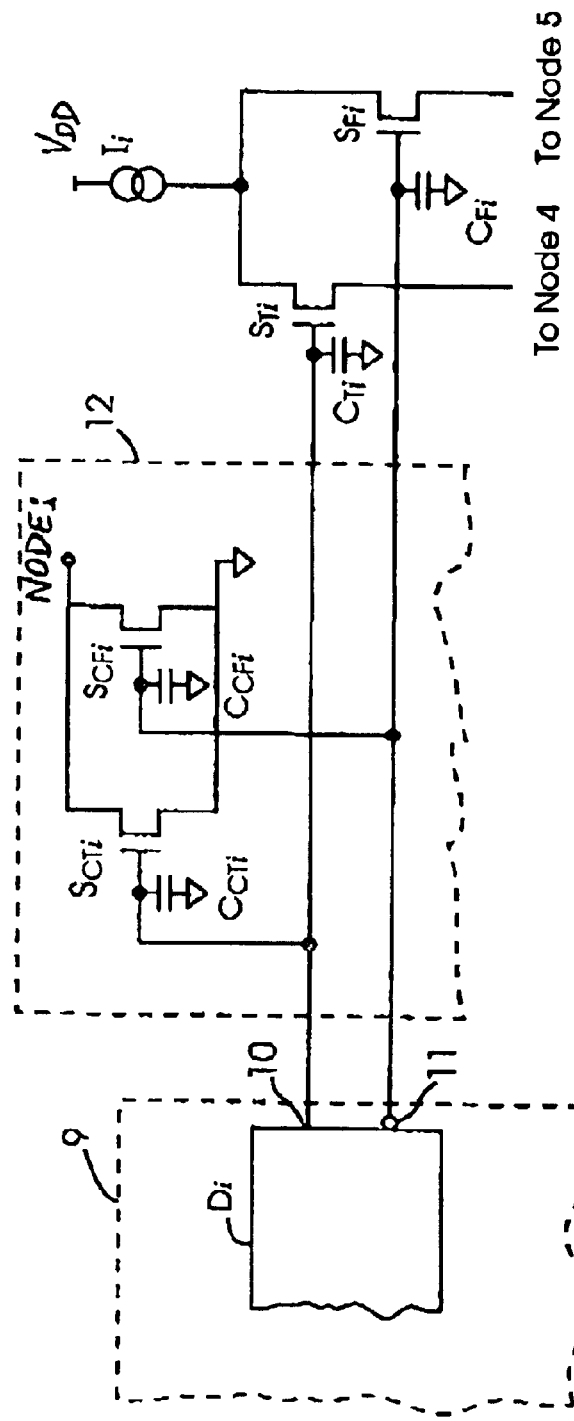
FIG. 6 is a circuit diagram of another part of the DAC of FIG. 2.

Referring now to FIG. 6, the principle behind the invention will now be described with reference to one of the current steering switches $S_{Ti}$, and one of the compensating switches $S_{CTi}$. The parasitic capacitance of the current steering switch $S_{Ti}$ is represented by the capacitor $C_{Ti}$. The parasitic capacitance of the compensating switch $S_{CTi}$ is represented by the capacitor $C_{CTi}$. By choosing the compensating switch $S_{CTi}$ as described with reference to the table of FIG. 3, the parasitic capacitance $C_{CTi}$ between the gate and the source and drain and the bulk parasitic capacitance of the compensating switch $S_{CTi}$ is such that the sum of the parasitic capacitance $C_{CTi}$ of the compensating switch $S_{CTi}$ and the parasitic capacitance $C_{Ti}$ of the corresponding current steering switch $S_{Ti}$ presented to the corresponding driver circuit $D_i$ will be constant for each combination of current steering switch $S_{Ti}$ and its corresponding compensating switch $S_{CTi}$. Similarly, for each combination of current steering switch $S_{Fi}$ and its corresponding compensating switch $S_{CFi}$, the combined parasitic capacitance presented to the corresponding driver circuit $D_i$ is $C_{Fi}+C_{CFi}$, and is constant, and similar to the sum of the parasitic capacitance $C_{Ti}+C_{CTi}$ for the current steering and compensating switches $S_{Ti}$ and $S_{CTi}$, respectively.

Figure 7:
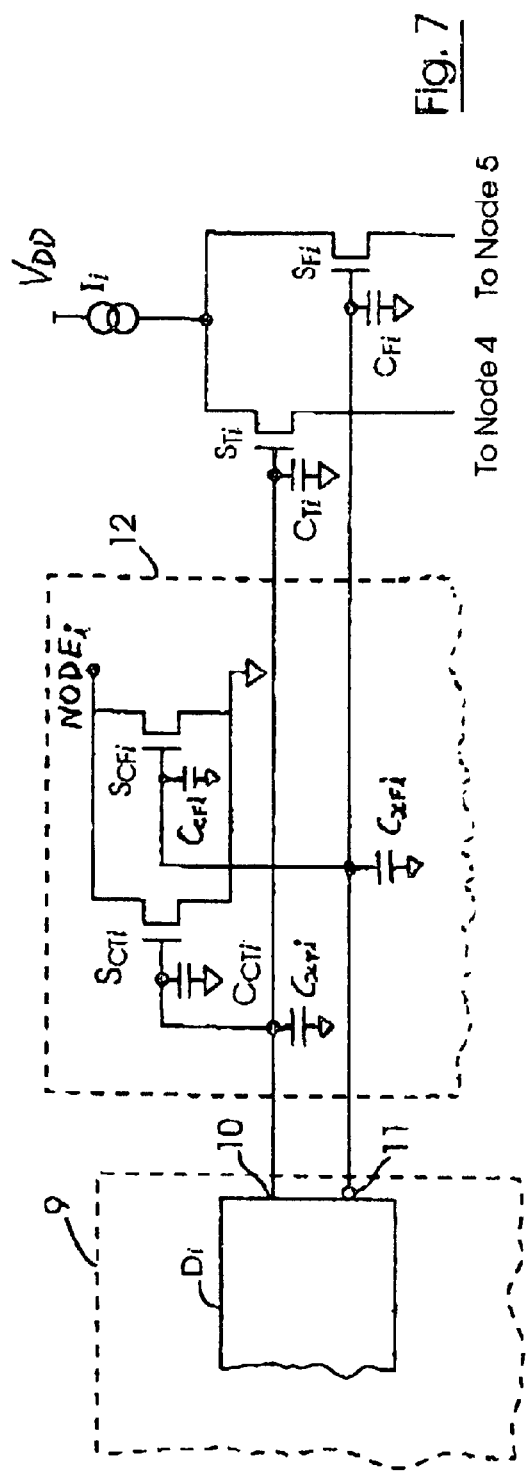
FIG. 7 is a circuit diagram of the portion of a DAC according to another embodiment of the invention.

Referring now to FIG. 7, there is illustrated a portion of a circuit of a current steering DAC according to another embodiment of the invention. The current steering DAC of this embodiment of the invention is substantially similar to the current steering DAC 1, and similar components are identified by the same reference numerals and letters. Although only one dual pair of current steering switches $S_{Ti}$ and $S_{Fi}$ of the current steering switches $S_{T0}$ and $S_{F0}$ to $S_{T(n-1)}$ and $S_{F(n-1)}$ are illustrated, it will be appreciated by those skilled in the art that the appropriate number of current steering switches and their corresponding compensating switches $S_{CTi}$ and $S_{CFi}$ will be provided. The main difference between the current steering DAC according to this embodiment of the invention and the current steering DAC 1 is in the switching signal generating circuit 9. Since the compensating switches $S_{CTi}$ and $S_{CFi}$ do not switch a load or a current corresponding to the currents $I_0$ to $I_{(n-1)}$ the compensating capacitance $C_{CTi}$ and $C_{CFi}$ of the respective compensating switches $S_{CTi}$ and $S_{CFi}$ may differ from the ideal compensating capacitance if they were switching corresponding currents $I_0$ to $I_{(n-1)}$. In the DAC according to this embodiment of the invention this slight discrepancy is compensated for by providing load correcting elements, which are provided by compensating capacitors $C_{xTi}$ and $C_{xFi}$ associated with the respective compensating switches $S_{CTi}$ and $S_{CFi}$, respectively. The capacitance of the compensating capacitors $C_{xTi}$ and $C_{xFi}$ is chosen, so that when added to the parasitic capacitance $C_{CTi}$ or $C_{CFi}$ of the corresponding compensating switches $S_{CTi}$ or $S_{CFi}$ and the current steering switches $S_{Ti}$ or $S_{Fi}$, the combined capacitance presented to the driver circuit $D_i$ is $[C_{xTi}+C_{CTi}+C_{Ti}]$ or $[C_{xFi}+C_{CFi}+C_{Fi}]$, respectively. Furthermore, the respective combined capacitances are equal as follows:

$$C_{xTi}+C_{CTi}+C_{Ti}=C_{xFi}+C_{CFi}+C_{Fi}.$$

The capacitance of the compensating capacitors $C_{xTi}$ and $C_{xFi}$ is determined from the equations below where $C_{Ti}$ is the parasitic capacitance of the current steering switches $S_{Ti}$ corresponding to bit i, and $C_{CTi}$ is the parasitic capacitance of the compensating switch $S_{CTi}$ corresponding to bit i, and the parasitic capacitance of the current steering and compensating switches $S_{Fi}$ and $S_{CFi}$ are $C_{CFi}$ and $C_{Fi}$, respectively, corresponding to bit i. Solving the capacitance equations for the switches $S_{Ti}$ and $S_{CTi}$ corresponding to the MSB and the LSB of an eight bit DAC with current steering switches of sizes set out in the table of FIG. 3, the total capacitance presented to each driver circuit D is a constant $C_k$, and thus $$C_k=C_{T0}+C_{CT0}+C_{xT0} \quad (1)$$

for the LSB, and $$C_k=C_{T7}+C_{CT7}+C_{xT7} \quad (2)$$

for the MSB
If the parasitic capacitance of the current steering switch $S_{T0}$ is $1C_L$ then equation (1) becomes:

$$C_{k0}=1C_L+xC_L+C_{xT0}$$

and equation (2) becomes:

$$C_{k7}=128C_L+yC_L+C_{xT7}$$

where $xC_L$ is the parasitic capacitance of the compensating switch $S_{CT0}$, and $yC_L$ is the parasitic capacitance of the compensating switch $S_{CT7}$.

If $y=1$ and $x=128$, then $C_{xT0}=C_{xT7}$.

Therefore, if additional capacitive effects, such as layout related interconnect capacitance of the type which would be encountered in an integrated circuit, add to the effective load presented to the driver circuits, these additional capacitive effects must be taken account of and made substantially similar. This is achieved by selecting the capacitors $C_{xTi}$ and $C_{xFi}$ to have the appropriate additional switching load compensating capacitance.

Alternatively, the load compensating elements instead of being provided by compensating switches, may be provided by other load compensating capacitive elements such as the compensating capacitors $C_{xTi}$ and $C_{xFi}$, and equations 1 and 2 would then become:

$$C_{k0}=1C_L+C_{xT0}$$

and equation 2 becomes:

$$C_{k7}=128C_L+C_{xT7}.$$

Thus, the capacitance of the compensating capacitors $C_{xT0}$ and $C_{xT7}$ would have to be scaled similarly as already described with reference to the capacitance of the compensating switches $S_{CT0}$ and $S_{CT7}$. Therefore, in an n bit DAC the load compensating capacitance of the compensating capacitors $C_{xT0}$ to $C_{xT(n-1)}$ would have to be scaled as already described with reference to the compensating switches $S_{CT0}$ to $S_{CT(n-1)}$. The compensating capacitors $C_{xF0}$ to $C_{xF(n-1)}$ would be similarly scaled. It is also envisaged that the load compensating circuit 12 may be provided with a combination of compensating switches $S_{CT0}$ to $S_{CT(n-1)}$ and compensating capacitors $C_{xT0}$ to $C_{xT(n-1)}$, both of which would be appropriately scaled so that the combined switching load presented to the respective driver circuits $D_0$ to $D_{n-1}$ would be similar for each driver circuit $D_0$ to $D_{n-1}$. The load compensating circuit 12 would similarly be provided with a corresponding combination of compensating switches $S_{CF0}$ to $S_{CF(n-1)}$ and compensating capacitors $C_{xF0}$ to $C_{xF(n-1)}$, both of which would be correspondingly scaled.

Figure 8:
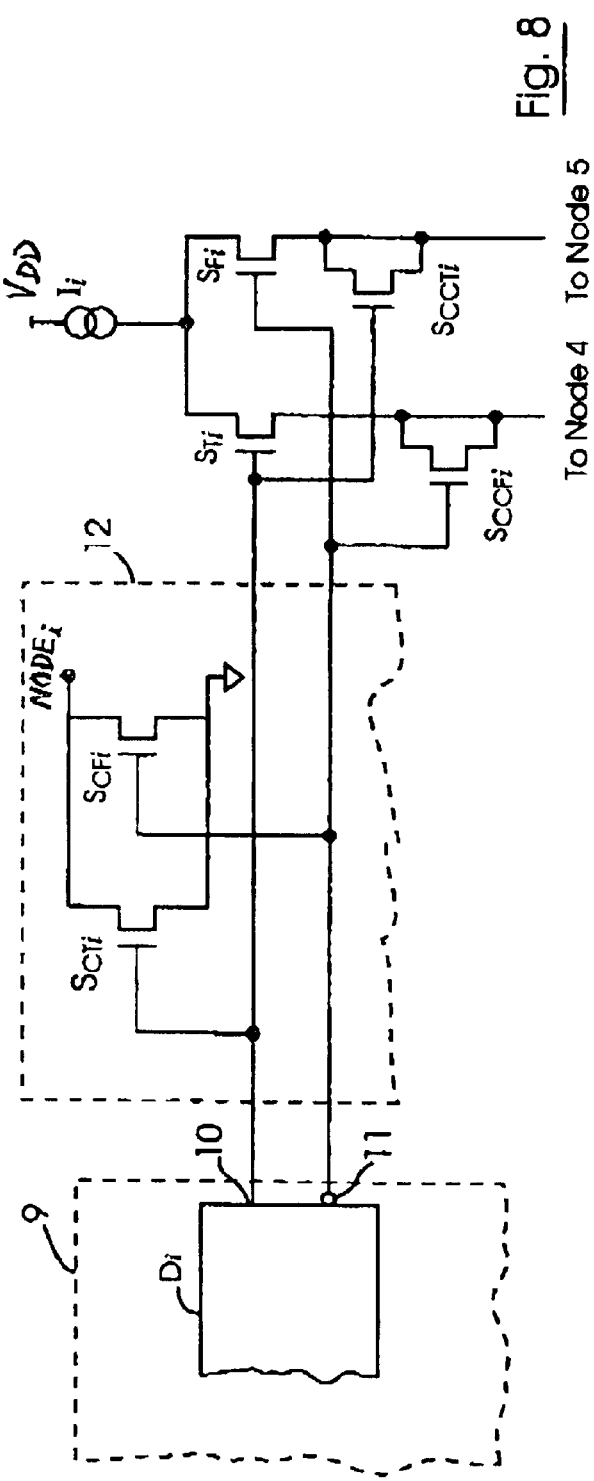
FIG. 8 is a circuit diagram of a portion of a DAC according to another embodiment of the invention.
Figure 2:
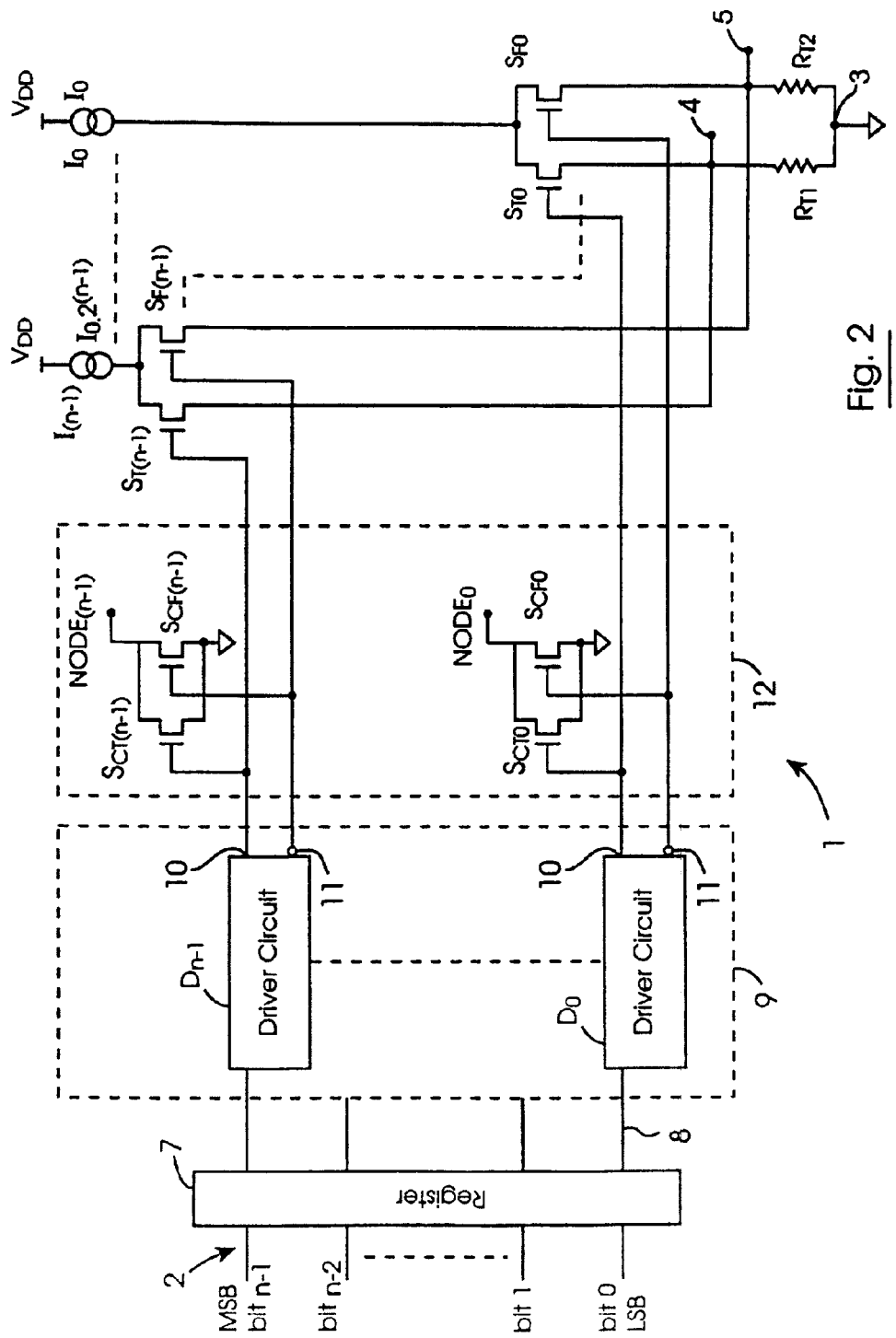
Figure 5:
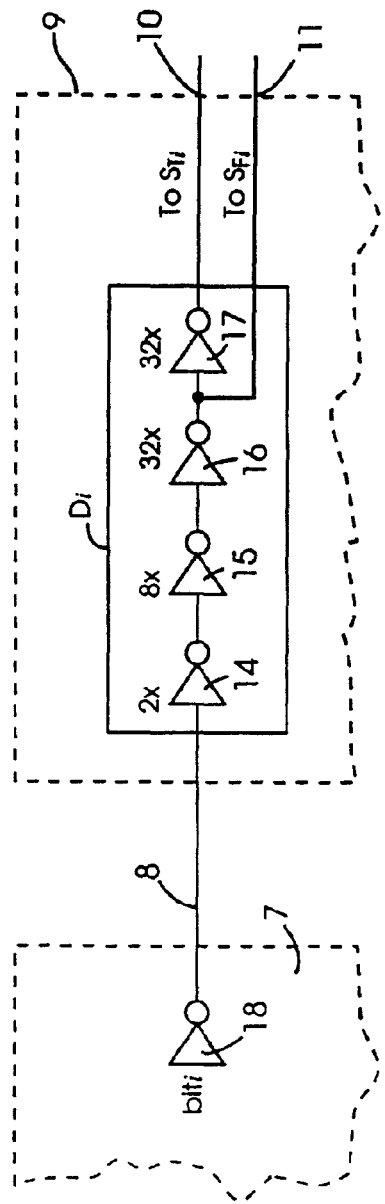
Figure 6:
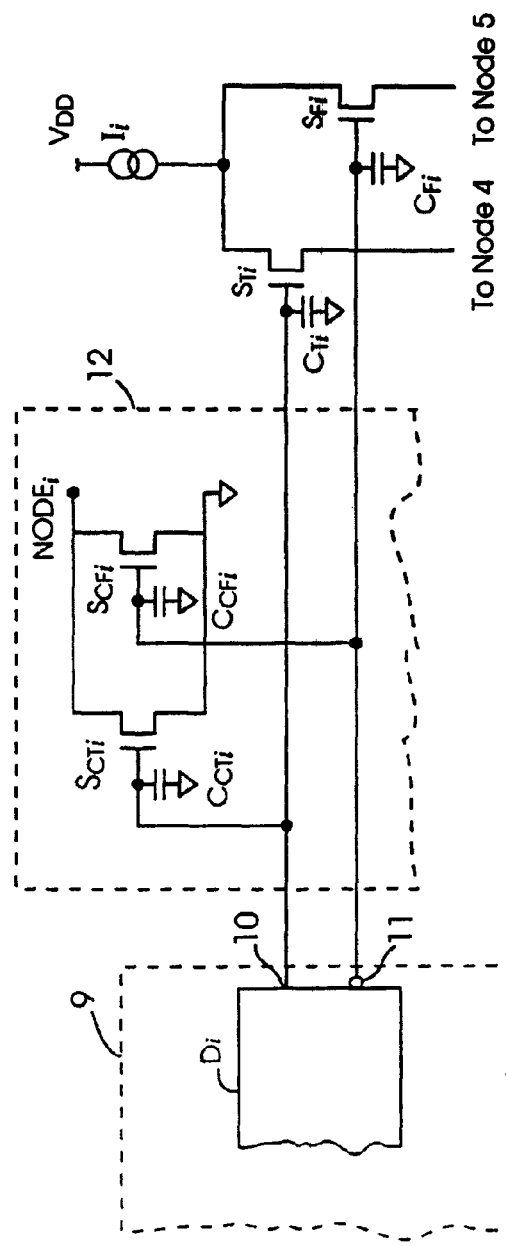
Figure 7:
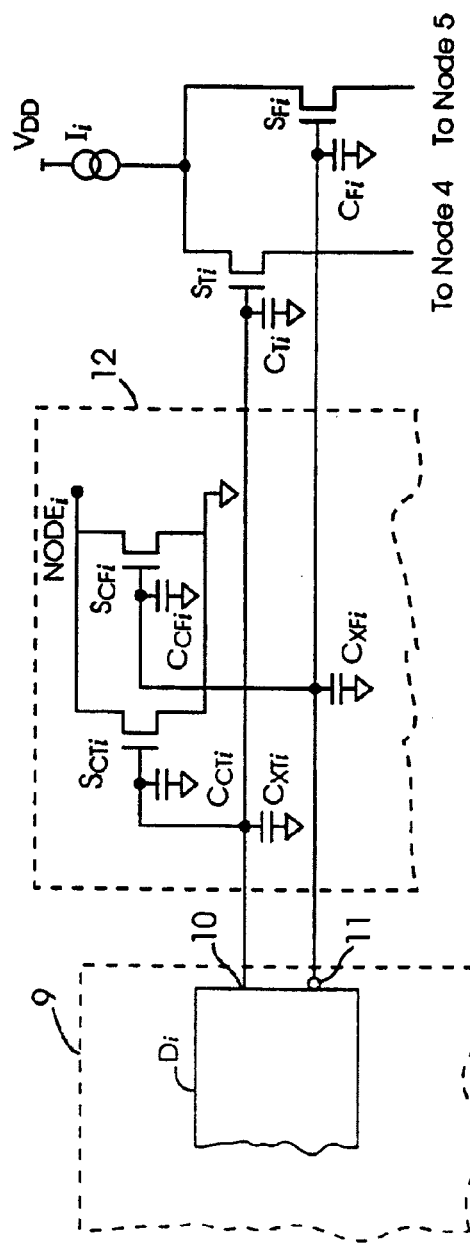
Figure 8:
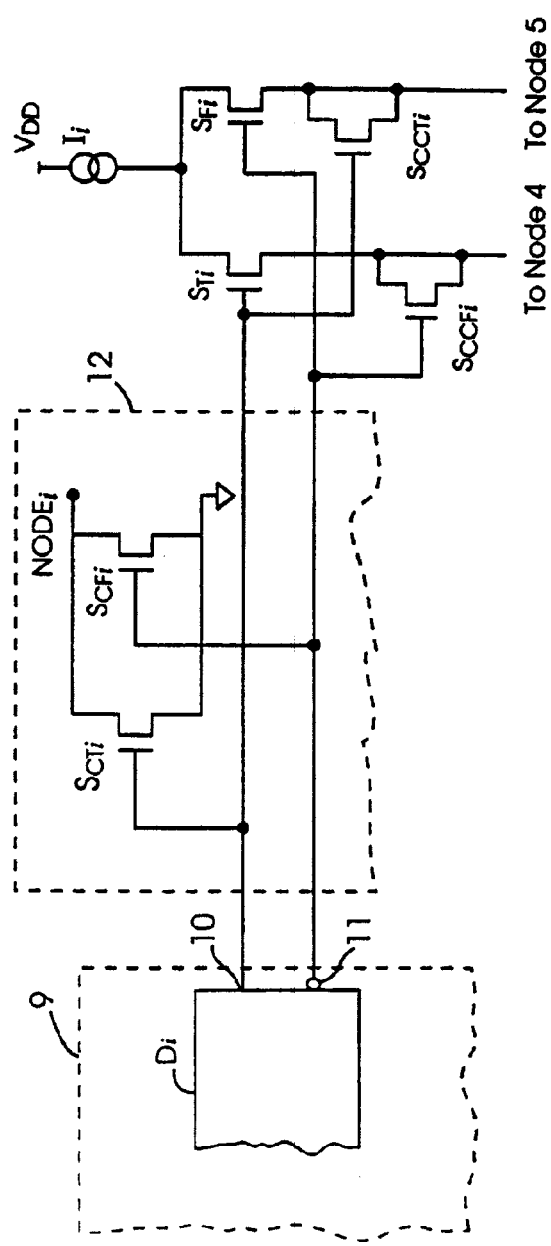

Referring now to FIGS. 8 and 9, and in particular to FIG. 8, there is illustrated a circuit of portion of a current steering DAC according to another embodiment of the invention which is substantially similar to the current steering DAC 1 described with reference to FIG. 2, and similar components are identified by the same reference numerals and letters. In this embodiment of the invention DAC output errors from switching signal coupling effects, which are generally defined as coupling errors are corrected. The DAC according to this embodiment of the invention comprises a switching signal generating circuit 9 which is similar to the switching signal generating circuit 9 of the DAC 2 of FIG. 2, and time-skewing is thus substantially eliminated from the current steering DAC of this embodiment of the invention. By virtue of the fact that time-skewing has been substantially eliminated from this current steering DAC, coupling errors can more easily be compensated for. In FIG. 8 only one dual pair of current steering switches $S_{Ti}$ and $S_{Fi}$ of the current steering switches $S_{T0}$ and $S_{F0}$ to $S_{T(n-1)}$ and $S_{F(n-1)}$ are illustrated. However, it will be appreciated by those skilled in the art that the appropriate number of current steering switches will be provided.

In this embodiment of the invention a pair of coupling compensating elements are provided by coupling compensating switches, namely, MOS switches $S_{CCTi}$ and $S_{CCFi}$. The coupling compensating switches $S_{CCTi}$ and $S_{CCFi}$ are provided by analogue MOS transistor switches of similar type to the current steering switches $S_{Ti}$ and $S_{Fi}$, and their respective source and drains are connected to a common point on the current circuit through the respective current steering switches $S_{Ti}$ and $S_{Fi}$, between the current steering switches $S_{Ti}$ and $S_{Fi}$ and the corresponding output summing nodes 4 and 5, respectively. The coupling compensating switch $S_{CCTi}$ which provides coupling compensation for the true current steering switch $S_{Ti}$ is located between the false current steering switch $S_{Fi}$ and its corresponding output summing node 5, while the coupling compensating switch $S_{CCFi}$ which provides coupling compensation for the false current steering switch $S_{Fi}$ is located between the true current steering switch $S_{Ti}$ and its corresponding output summing node 4.

Both the source and the drain of each coupling compensating switch $S_{CCTi}$ and $S_{CCFi}$ are connected to the line connecting the adjacent false or true current steering switch $S_{Fi}$ or $S_{Ti}$ to the corresponding summing node 5 or 4. The gates of the coupling compensating switches $S_{CCTi}$ and $S_{CCFi}$ are coupled to the gates of the corresponding current steering switch $S_{Ti}$ and $S_{Fi}$ and in turn to the corresponding driver circuit $D_i$. Thus, the parasitic capacitance between the gates and the respective source and drain of the coupling compensating switches $S_{CCTi}$ and $S_{CCFi}$ provide coupling compensating capacitance for the corresponding current steering switches $S_{Ti}$ and $S_{Fi}$. Since the coupling compensating switches $S_{CCTi}$ and $S_{CCFi}$ provide compensating capacitance between the gate and the respective source and drain of each switch $S_{CCTi}$ and $S_{CCFi}$, the coupling compensating switches $S_{CCTi}$ and $S_{CCFi}$ are typically half the size of the corresponding current steering switches $S_{Ti}$ and $S_{Fi}$.

Referring now to the table of FIG. 9, the switch sizes of the DAC according to this embodiment of the invention are set out. In the table of FIG. 9, it is assumed that the DAC is an eight bit DAC. Column 1 sets out the bit number of the digital word from bit 0 corresponding to the LSB to bit 7 corresponding to the MSB. Column 2 sets out the switch sizes of the current steering switches $S_{T0}$ to $S_{T7}$. Column 3 sets out appropriate sizes for the coupling compensating switches $S_{CCT0}$ to $S_{CCT7}$. Column 4 sets out the corresponding sizes of the compensating switches $S_{CT0}$ to $S_{CT7}$ so that the total switching load presented to the driver circuits $D_0$ to $D_7$ is equivalent to a switch size 193 times the size of the current steering switch $S_{T0}$. While switch sizes for the current steering switches $S_{T0}$ to $S_{T7}$, the coupling compensating switches $S_{CT0}$ to $S_{CT7}$ and the load compensating switches $S_{CT0}$ to $S_{CT7}$ have been set out in columns 2, 3 and 4, respectively, of the table of FIG. 9, the corresponding switch sizes for the current steering switches $S_{F0}$ to $S_{F7}$, the coupling compensating switches $S_{CCF0}$ to $S_{CCF7}$ and the load compensating switches $S_{CF0}$ to $S_{CF7}$ will be similar.

Referring now to the table of FIG. 10, similar values for current steering switches $S_{Ti}$, coupling compensating switches $S_{CCTi}$ and compensating switches $S_{CTi}$ are set out in columns 1 to 3, respectively for an eight bit segmented current steering DAC according to another embodiment of the invention. The current steering switch $S_{Ti}$ corresponding to bit 6 is provided by two current steering switches $S_{T6a}$ and $S_{T6b}$ each of which are $2^5$ times the size of the current steering switch $S_{T0}$ corresponding to bit 0, namely, the LSB. The current steering switch $S_{Ti}$ corresponding to bit 7 is provided by four current steering switches $S_{T7a}$, $S_{T7b}$, $S_{T7c}$ and $S_{T7d}$, each of size $2^5$ times the size of the current steering switch $S_{T0}$. Accordingly, the compensating switch $S_{CTi}$ corresponding to bit 6 is provided by two compensating switches $S_{CT6a}$ and $S_{CT6b}$, each of size $2^0$ times the size of the current steering switch $S_{T0}$ corresponding to bit zero. In other words, the compensating switches $S_{CT6a}$ and $S_{CT6b}$ are of size equal to that of the current steering switch $S_{T0}$. The compensating switch $S_{CTi}$ corresponding to bit 7 is provided by four compensating switches $S_{CT7a}$, $S_{CT7b}$, $S_{CT7c}$ and $S_{CT7}$d, each of size $2^0$ times the size of the current steering switch $S_{T0}$. The coupling compensating switch $S_{CCTi}$ corresponding to bit 6 is provided by two coupling compensating switches $S_{CCT6a}$ and $S_{CCT6b}$, each of size $2^4$ times the size of the current steering switch $S_{T0}$ corresponding to bit zero. The coupling compensating switch $S_{CCTi}$ corresponding to bit 7 is provided by four coupling compensating switches $S_{CCT7a}$, $S_{CCT7b}$, $S_{CCT7c}$ and $S_{CCT7d}$, each of size $2^4$ times the size of the current steering switch $S_{T0}$ corresponding to bit zero. In all cases the sizes of the switches $S_{Ti}$, $S_{CCTi}$ and $S_{CTi}$ sum to forty-nine times the size of the current steering switch $S_{T0}$ corresponding to bit zero. Thus, each driver circuit $D_0$ to $D_7$ is presented with a similar switching load equivalent to a switch of size forty-nine times the size of the switch $S_{T0}$, and the driver circuits $D_0$ to $D_7$ are similar to each other. Although not illustrated, it will be appreciated that the segmented DAC according to this embodiment of the invention will be provided with current steering switches $S_{F0}$ to $S_{F7}$, compensating switches $S_{CF0}$ to $S_{CF7}$ and coupling compensating switches $S_{CCF0}$ to $S_{CCF7}$, corresponding to the corresponding ones of the current steering switches $S_{T0}$ to $S_{T7}$, the compensating switches $S_{CT0}$ to $S_{CT7}$ and the coupling compensating switches $S_{CCT0}$ to $S_{CCT7}$, respectively.

In this specification the terms "similar", "substantially similar", "identical" and "equal" have been used to describe the similarity between the switching loads presented to the driver circuits, the similarity of the driver circuits, and the similarity of the switching signals, it will be appreciated that in an ideal circuit, the driver circuits would be identical to each other, and the switching signals would be identical to each other, and the compensating switches, coupling compensating switches and the compensating capacitors would be chosen to ensure that the switching loads presented to the driver circuits would be identical to each other. However, in practical implementations of the invention while the driver circuits will be substantially similar to each other, the switching signals will be substantially similar to each other, and the switching loads presented to the driver circuits will be substantially similar to each other, they may not be identical to each other, and thus in this specification and in the claims it is intended that the terms "similar", "identical" and "equal" be interpreted in a practical manner to allow for manufacturing tolerances and other practical variations and limitations.

While the DAC described with reference to the table of FIG. 10 has been described as being a segmented DAC in which the current steering switches corresponding to bits 5, 6 and 7 are described as being segmented, it will be readily apparent to those skilled in the art that where the current steering DAC is provided as a segmented DAC, segmentation may occur in any desired part of the DAC.

While the DACs according to the invention have been described as being implemented as eight bit DACs, it will be readily apparent to those skilled in the art that the DACs may be implemented in any desired size. Additionally, while the scaled load compensating circuit, the load correcting elements and the coupling compensating elements have been described for use with current switching circuits comprising scaled current steering switches of current steering DACs, it will be readily apparent to those skilled in the art that the scaled load compensating circuit according to the invention, the load correcting elements and the coupling compensating elements may be used in conjunction with any switch circuit which comprises scaled current steering switches.

Additionally, while the compensating switches and the coupling compensating switches have been described as being MOS transistor switches, they may be implemented as any type of switches, whether CMOS, PMOS, NMOS, and the choice of the type of switches will, in general, be dependent upon the type of the current steering switches, since optimum results are achieved by providing the compensating switches and the coupling compensating switches as being of the same type as the corresponding current steering switches. Needless to say, the compensating switches and the coupling compensating switches may be implemented as any other suitable type of switches or other suitable capacitive elements.

While a specific type of driver circuit has been described, it is envisaged that other types of driver circuits may be used, and such other types of driver circuit will be readily apparent to those skilled in the art.

It is also envisaged that while the sources of the pairs $S_{CTi}$ and $S_{CFi}$ of the compensating switches have been described as being connected together to a floating node, the sources of the compensating switches may each be connected to a separate node, and the nodes may be floating or otherwise. Indeed, the compensating switches may be connected in such a way as to switch a current, and the currents switched by the compensating switches may, for example, be binarily scaled. Whether the source or drain is connected to ground or otherwise will depend on the type of switch the compensating switches are, and also on their implementation in the circuit in which they are implemented.

While a dual compensating switch pair has been described as being provided for each corresponding current steering dual switch pair, in other words, while a compensating switch has been provided for each current steering switch in the DACs which have been described according to the invention, it is envisaged that in certain cases, a compensating switch may not be provided for every current steering switch. For example, it is envisaged that a compensating switch may not be provided for the current steering switch corresponding to the MSB, however, compensating switches would be provided for the current steering switches $S_{T0}$ and $S_{F0}$ to $S_{T(n-2)}$ and $S_{F(n-2)}$ in order to bring the sum of the combined sizes of the current steering switches and their corresponding compensating switches to a combined size equal to the size of the current steering switch corresponding to the MSB. It will also of course be appreciated that the compensating switch corresponding to the current steering switch which corresponds to the MSB need not necessarily be of size similar to the current steering switch corresponding to the LSB. The size of the compensating switch corresponding to the MSB may be a multiple or a fraction of the size of the current steering switch corresponding to the LSB.

What is claimed is:

1. A compensating circuit for providing switching load compensation for a plurality of scaled current steering switches selectively operable from one state to another state in response to respective switching signals, the compensating circuit being provided for facilitating substantially simultaneous switching of selected ones of the switches from one of the states to the other state in response to simultaneously applied switching signals, and comprising a scaled load compensating circuit for providing scaled switching load compensation for at least some of the current steering switches so that the switching loads presented to driver circuits of the respective current steering switches for switching thereof are substantially similar, the scaled load compensating circuit comprising:

a plurality of load compensating elements, one load compensating element being provided corresponding to each current steering switch for which switching load compensation is to be provided, the values of the switching load compensation provided by the respective load compensating elements being such that when combined with the switching load of the corresponding current steering switch, the combined switching load presented to the corresponding driver circuit is substantially similar for each current steering switch and its corresponding load compensating element, so that the selected current steering switches are switched from one of the states to the other state substantially simultaneously in response to simultaneously applied switching signals.

2. A compensating circuit as claimed in claim 1 in which the compensating circuit comprises the driver circuits, and the driver circuits are substantially similar to each other.

3. A compensating circuit as claimed in claim 1 in which each load compensating element comprises a load compensating switch, the switching load compensation being derived from the switching load of the load compensating switch.

4. A compensating circuit as claimed in claim 3 in which each load compensating switch is of similar type to that of the corresponding current steering switch.

5. A compensating circuit as claimed in claim 3 in which the load compensating switches are scaled so that the switching load compensation provided by the respective load compensating switches is complementary to the switching loads of the current steering switches.

6. A compensating circuit as claimed in claim 3 in which the load compensating switch presenting the largest switching load compensation corresponds to the current steering switch presenting the smallest switching load for which switching load compensation is to be provided, and the load compensating switch presenting the smallest switching load compensation corresponds to the current steering switch presenting the largest switching load for which switching load compensation is to be provided.

7. A compensating circuit as claimed in claim 3 in which the load compensating switches are binarily scaled in descending order for compensating for current steering switches which are binarily scaled in ascending order.

8. A compensating circuit as claimed in claim 3 in which each load compensating switch is a non-load switching switch.

9. A compensating circuit as claimed in claim 8 in which a load correcting element associated with each load compensating switch is provided for correcting for the difference between an ideal switching load of the corresponding load compensating switch if the load compensating switch were switching a load, and the actual switching load compensation provided by the load compensating switch.

10. A compensating circuit as claimed in claim 3 in which each load compensating element provides capacitive switching load compensation.

11. A compensating circuit as claimed in claim 1 in which a coupling compensating element is provided for at least some of the current steering switches for compensating for distortion resulting from switching signal coupling effects.

12. A compensating circuit as claimed in claim 11 in which each coupling compensating element comprises a coupling compensating switch, and the coupling compensation is derived from the parasitic capacitance of the coupling compensating switch between the gate of the switch and the source and drain thereof.

13. A compensating circuit as claimed in claim 12 in which the source and drain of each coupling compensating switch are electrically connected together.

14. A switch circuit comprising:

a plurality of scaled current steering switches selectively operable from one state to another state in response to respective switching signals, and a scaled load compensating circuit for providing scaled switching load compensation for at least some of the current steering switches so that the switching loads presented to driver circuits of the respective current steering switches for switching thereof are substantially similar, for facilitating substantially simultaneous switching of selected ones of the switches from one of the states to the other state in response to simultaneously applied switching signals, the scaled load compensating circuit comprising:

a plurality of load compensating elements, one load compensating element being provided corresponding to each current steering switch for which switching load compensation is to be provided, the values of the switching load compensation provided by the respective load compensating elements being such that when combined with the switching load of the corresponding current steering switch, the combined switching load presented to the corresponding driver circuit is substantially similar for each current steering switch and its corresponding load compensating element, so that the selected current steering switches are switched from one of the states to the other state substantially simultaneously in response to simultaneously applied switching signals.

15. A switch circuit as claimed in claim 14 in which the switching circuit comprises the driver circuits, and the driver circuits are substantially similar to each other.

16. A switch circuit as claimed in claim 14 in which one load compensating element is provided for each current steering switch.

17. A switch circuit as claimed in claim 14 in which each load compensating element comprises a load compensating switch, the switching load compensation being derived from the switching load of the load compensating switch.

18. A switch circuit as claimed in claim 17 in which each load compensating switch is of similar type to that of the corresponding current steering switch.

19. A switch circuit as claimed in claim 17 in which the load compensating switches are scaled so that the switching load compensation provided by the respective load compensating switches is complementary to the switching loads of the current steering switches.

20. A switch circuit as claimed in claim 18 in which the load compensating switch presenting the largest switching load compensation corresponds to the current steering switch presenting the smallest switching load for which switching load compensation is to be provided, and the load compensating switch presenting the smallest switching load compensation corresponds to the current steering switch presenting the largest switching load for which switching load compensation is to be provided.

21. A switch circuit as claimed in claim 17 in which the current steering switches are binarily scaled in ascending order, and the load compensating switches are binarily scaled in descending order.

22. A switch circuit as claimed in claim 17 in which each load compensating switch is a non-load switching switch.

23. A switch circuit as claimed in claim 22 in which a load correcting element associated with each load compensating switch is provided for correcting for the difference between an ideal switching load of the corresponding load compensating switch if the load compensating switch were switching a load, and the actual switching load compensation provided by the load compensating switch.

24. A switch circuit as claimed in claim 17 in which the switching circuit is implemented in an integrated circuit, and each current steering switch is a MOS switch, having a capacitive switching load, and each load compensating element providing a capacitive switching load compensation.

25. A switch circuit as claimed in claim 14 in which the current steering switches are provided in switch pairs, and the load compensating elements are provided in corresponding pairs.

26. A switch circuit claimed in claim 14 in which a coupling compensating element is provided for at least some of the current steering switches for compensating for distortion resulting from switching signal coupling effects.

27. A switch circuit as claimed in claim 26 in which each coupling compensating element comprises a coupling compensating switch, and the coupling compensation is derived from the parasitic capacitance of the coupling compensating switch between the gate of the switch and the source and drain thereof.

28. A switch circuit as claimed in claim 27 in which the source and drain of each coupling compensating switch are electrically connected together.

29. A current steering digital to analogue converter comprising:

a plurality of binarily scaled current steering switches operable from one state to another state in response to switching signals for selectively switching currents through selected ones of the current steering switches to a common node, and a scaled load compensating circuit for providing scaled switching load compensation for at least some of the current steering switches so that the switching loads presented to driver circuits of the respective current steering switches for switching thereof are substantially similar, for facilitating substantially simultaneous switching of selected ones of the current steering switches from one of the states to the other state in response to the simultaneously applied switching signals, the scaled load compensating circuit comprising:

a plurality of load compensating elements, one load compensating element being provided corresponding to each current steering switch for which switching load compensation is to be provided, the values of the switching load compensation provided by the respective load compensating elements being such that when combined with the switching load of the corresponding current steering switch, the combined switching load presented to the corresponding driver circuit is substantially similar for each current steering switch and its corresponding load compensating element, so that the selected current steering switches are switched from one of the states to the other state substantially simultaneously in response to simultaneously applied switching signals.

30. A current steering digital to analogue converter as claimed in claim 29 in which the digital to analogue converter comprises the driver circuits, and the driver circuits are substantially similar to each other.

31. A method for minimising time-skew in the selective switching of a plurality of current steering switches from one state to another state in response to respective simultaneously applied switching signals, the method comprising the step of providing scaled load compensation for at least some of the current steering switches so that the switching loads presented to driver circuits of the respective current steering switches are substantially similar, for facilitating substantially simultaneous switching of selected ones of the current steering switches from one of the states to the other state in response to the simultaneously applied switching signals, the scaled load compensation being provided by respective load compensating elements for the current steering switches for which load compensation is to be provided, the values of the switching load compensation provided by the respective load compensating elements being such that when combined with the switching load of the corresponding current steering switch, the combined switching load presented to the corresponding driver circuit is substantially similar for each current steering switch and its corresponding load compensating element, so that the selected current steering switches are switched from one of the states to the other state substantially simultaneously in response to simultaneously applied switching signals.

32. A method as claimed in claim 31 in which the driver circuits are provided to be substantially similar to each other.

33. A method as claimed in claim 31 in which one load compensating element is provided for each current steering switch.

34. A method as claimed in claim 31 in which each load compensating element is provided by a load compensating switch, the switching load compensation being derived from the switching load of the load compensating switch.

35. A method as claimed in claim 34 in which each load compensating switch is of similar type to that of the corresponding current steering switch.

36. A method as claimed in claim 34 in which the load compensating switches are scaled so that the switching load compensation provided by the respective load compensating switches is complementary to the switching loads of the current steering switches.

37. A method as claimed in claim 34 in which the load compensating switch presenting the largest switching load compensation corresponds to the current steering switch presenting the smallest switching load for which switching load compensation is to be provided, and the load compensating switch presenting the smallest switching load compensation corresponds to the current steering switch presenting the largest switching load for which switching load compensation is to be provided.

38. A method as claimed in claim 34 in which each load compensating switch is a non-load switching switch.

39. A method as claimed in claim 38 in which a load correcting element associated with each load compensating switch is provided for correcting for the difference between an ideal switching load of the corresponding load compensating switch if the load compensating switch were switching a load, and the actual switching load compensation provided by the load compensating switch.

40. A method as claimed in claim 31 in which a coupling compensating element is provided for at least some of the current steering switches for compensating for distortion resulting from switching signal coupling effects.

* * * * *

UNITED STATES PATENT AND TRADEMARK OFFICE
CERTIFICATE OF CORRECTION

| | |
|---|---|
| PATENT NO. | : 6,747,583 B2 |
| APPLICATION NO. | : 10/184541 |
| DATED | : June 8, 2004 |
| INVENTOR(S) | : Tucholski et al. |

It is certified that error appears in the above-identified patent and that said Letters Patent is hereby corrected as shown below:

The Title page showing the print figure should be deleted, and replaced with the attached amended title page.

Drawing sheets, consisting of Fig. 1 - 10, should be deleted and replaced with the drawing sheets, consisting of Fig. 1 - 10, as shown on the attached pages.

Signed and Sealed this

Twenty-seventh Day of June, 2006

JON W. DUDAS
*Director of the United States Patent and Trademark Office*

United States Patent
Tucholski et al.

(12)

(10) Patent No.: US 6,747,583 B2
(45) Date of Patent: Jun. 8, 2004

(54) COMPENSATING CIRCUIT FOR USE IN A SWITCH CIRCUIT COMPRISING SCALED CURRENT STEERING SWITCHES, A SWITCH CIRCUIT COMPRISING THE COMPENSATING CIRCUIT, AND A METHOD FOR MINIMISING TIME-SKEW IN SWITCHING SCALED CURRENT STEERING SWITCHES

(75) Inventors: Hans Juergen Tucholski, Limerick (IE); Anthony Lawrence O'Brien, Limerick (IE)

(73) Assignee: Analog Devices, Inc., Norwood, MA (US)

( * ) Notice: Subject to any disclaimer, the term of this patent is extended or adjusted under 35 U.S.C. 154(b) by 10 days.

(21) Appl. No.: 10/184,541

(22) Filed: Jun. 28, 2002

(65) Prior Publication Data

US 2003/0001656 A1 Jan. 2, 2003

Related U.S. Application Data

(60) Provisional application No. 60/302,025, filed on Jun. 29, 2001.

(51) Int. Cl.[7] ............................................. H03M 1/06
(52) U.S. Cl. .................... 341/118; 341/120; 341/136; 341/143
(58) Field of Search ........................ 341/118, 120, 341/136, 143, 144, 159, 172

(56) References Cited

U.S. PATENT DOCUMENTS

| | | | | |
|---|---|---|---|---|
| 5,373,294 A | * | 12/1994 | Sun | 341/144 |
| 5,394,146 A | * | 2/1995 | Arimoto | 341/118 |
| 5,463,394 A | * | 10/1995 | Sun | 341/144 |
| 5,541,598 A | * | 7/1996 | Malek-Khosravi | 341/118 |
| 5,612,696 A | * | 3/1997 | Kim | 341/118 |
| 5,825,317 A | * | 10/1998 | Anderson et al. | 341/118 |
| 5,859,606 A | * | 1/1999 | Schrader et al. | 341/144 |

* cited by examiner

*Primary Examiner*—Michael Tokar
*Assistant Examiner*—Lam T. Mai
(74) *Attorney, Agent, or Firm*—Iandiorio & Teska

(57) ABSTRACT

"A compensating circuit for use in a switch circuit comprising scaled current steering switches, a switch circuit comprising the compensating circuit, and a method for minimising time-skew in switching scaled current steering switches"

An eight bit current steering DAC comprising scaled current steering switches ($S_{T0}, S_{F0}, S_{T(n-1)}, S_{F(n-1)}$) (where n=8) comprises a comprising plurality of compensating MOS switches ($S_{CT0}$ and $S_{CF0}$ to $S_{CT(n-1)}$) for minimising time-skew when switching selected ones of the current steering switches from one state to another. The compensating switches ($S_{CT}, S_{CF}$) are of type similar to the current steering switches ($S_{Ti}$ and $S_{Fi}$), and are sized so that the combined switching load presented to the corresponding driver circuit ($D_i$) by the sum of the parasitic load capacitance of the current steering switch ($S_{Ti}$ or $S_{Fi}$) and the corresponding compensating switch ($S_{CTi}$ or $S_{CFi}$) is substantially similar for each driver circuit ($D_i$). Thereby, selected current steering switches ($S_{T0}$ and $S_{F0}$ to $S_{T(n-1)}$ and $S_{F(n-1)}$) are simultaneously switched in response to simultaneously applied switching signals from the driver circuits ($D_i$).

40 Claims, 7 Drawing Sheets

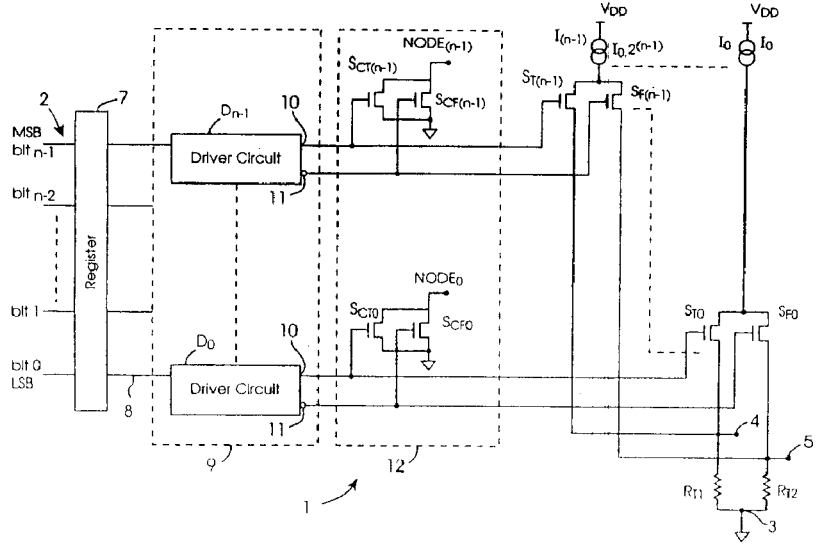

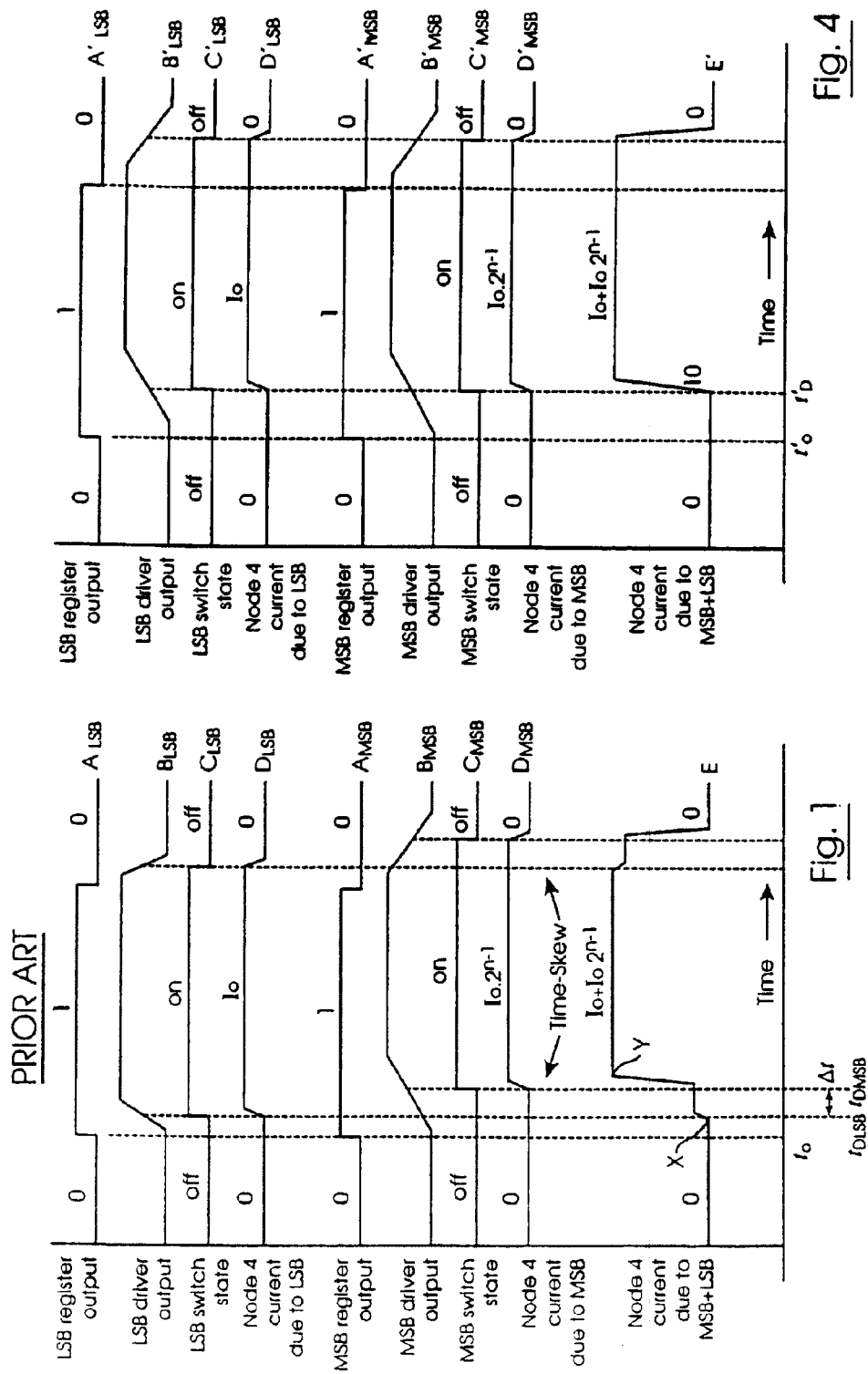

Fig. 3

| Column 1 | Column 2 | | Column 3 | | Column 4 |
|---|---|---|---|---|---|
| Bit number | Scaled Current Steering Switches | | Scaled Load Compensating switches | | Total Combined Switch Size Proportional to Switching Load |
| | Switch | Size | Switch | Size | |
| 0  LSB | $S_{T0}$ | 1 | $S_{CT0}$ | 128 | 129 |
| 1 | $S_{T1}$ | 2 | $S_{CT1}$ | 127 | 129 |
| 2 | $S_{T2}$ | 4 | $S_{CT2}$ | 125 | 129 |
| 3 | $S_{T3}$ | 8 | $S_{CT3}$ | 121 | 129 |
| 4 | $S_{T4}$ | 16 | $S_{CT4}$ | 113 | 129 |
| 5 | $S_{T5}$ | 32 | $S_{CT5}$ | 97 | 129 |
| 6 | $S_{T6}$ | 64 | $S_{CT6}$ | 65 | 129 |
| 7  MSB | $S_{T7}$ | 128 | $S_{CT7}$ | 1 | 129 |

| Column 1 | Column 2 | | Column 3 | | Column 4 | | Column 5 |
|---|---|---|---|---|---|---|---|
| Bit number | Scaled Current Steering Switches | | Coupling Compensating Switches | | Scaled Load Compensating switches | | Total Combined Switch Size Proportional to Switching Load |
| | Switch | Size | Switch | Size | Switch | Size | |
| 0 LSB | $S_{I0}$ | 1 | $S_{CCI0}$ | 0.5 | $S_{CI0}$ | 191.5 | 193 |
| 1 | $S_{I1}$ | 2 | $S_{CCI1}$ | 1 | $S_{CI1}$ | 190 | 193 |
| 2 | $S_{I2}$ | 4 | $S_{CCI2}$ | 2 | $S_{CI2}$ | 187 | 193 |
| 3 | $S_{I3}$ | 8 | $S_{CCI3}$ | 4 | $S_{CI3}$ | 181 | 193 |
| 4 | $S_{I4}$ | 16 | $S_{CCI4}$ | 8 | $S_{CI4}$ | 169 | 193 |
| 5 | $S_{I5}$ | 32 | $S_{CCI5}$ | 16 | $S_{CI5}$ | 145 | 193 |
| 6 | $S_{I6}$ | 64 | $S_{CCI6}$ | 32 | $S_{CI6}$ | 97 | 193 |
| 7 MSB | $S_{I7}$ | 128 | $S_{CCI7}$ | 64 | $S_{CI7}$ | 1 | 193 |

Fig. 9

| Column 1 | Column 2 | | Column 3 | | Column 4 | | Column 5 |
|---|---|---|---|---|---|---|---|
| Bit number | Scaled Current Steering Switches | | Coupling Compensating Switches | | Scaled Load Compensating switches | | Total Combined Switch Size Proportional to Switching Load |
| | Switch | Size | Switch | Size | Switch | Size | |
| 0 LSB | $S_{T0}$ | 1 | $S_{CCT0}$ | 0.5 | $S_{CT0}$ | 47.5 | 49 |
| 1 | $S_{T1}$ | 2 | $S_{CCT1}$ | 1 | $S_{CT1}$ | 46 | 49 |
| 2 | $S_{T2}$ | 4 | $S_{CCT2}$ | 2 | $S_{CT2}$ | 43 | 49 |
| 3 | $S_{T3}$ | 8 | $S_{CCT3}$ | 4 | $S_{CT3}$ | 37 | 49 |
| 4 | $S_{T4}$ | 16 | $S_{CCT4}$ | 8 | $S_{CT4}$ | 25 | 49 |
| 5 | $S_{T5}$ | 32 | $S_{CCT5}$ | 16 | $S_{CT5}$ | 1 | 49 |
| 6 | $S_{T6a}$ | 32 | $S_{CCT6a}$ | 16 | $S_{CT6a}$ | 1 | 49 |
| | $S_{T6b}$ | 32 | $S_{CCT6b}$ | 16 | $S_{CT6b}$ | 1 | 49 |
| 7 MSB | $S_{T7a}$ | 32 | $S_{CCT7a}$ | 16 | $S_{CT7a}$ | 1 | 49 |
| | $S_{T7b}$ | 32 | $S_{CCT7b}$ | 16 | $S_{CT7b}$ | 1 | 49 |
| | $S_{T7c}$ | 32 | $S_{CCT7c}$ | 16 | $S_{CT7c}$ | 1 | 49 |
| | $S_{T7d}$ | 32 | $S_{CCT7d}$ | 16 | $S_{CT7d}$ | 1 | 49 |

Fig. 10